(12) United States Patent
Chang et al.

(10) Patent No.: US 10,164,107 B2
(45) Date of Patent: Dec. 25, 2018

(54) EMBEDDED SOURCE OR DRAIN REGION OF TRANSISTOR WITH LATERALLY EXTENDED PORTION

(71) Applicant: TAIWAN SEMICONDUCTOR MANUFACTURING COMPANY LTD., Hsinchu (TW)

(72) Inventors: Che-Cheng Chang, New Taipei (TW); Chang-Yin Chen, Taipei (TW); Yung Jung Chang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/163,391

(22) Filed: Jan. 24, 2014

(65) Prior Publication Data

US 2015/0214368 A1 Jul. 30, 2015

(51) Int. Cl.
*H01L 29/78* (2006.01)
*H01L 29/66* (2006.01)

(52) U.S. Cl.
CPC .... *H01L 29/7851* (2013.01); *H01L 29/66795* (2013.01); *H01L 29/7848* (2013.01)

(58) Field of Classification Search
CPC .......... H01L 29/7848; H01L 29/66795; H01L 29/7851
See application file for complete search history.

(56) References Cited

U.S. PATENT DOCUMENTS

| | | |
|---|---|---|
| 2006/0138398 A1 | 6/2006 | Shimamune et al. |
| 2006/0145273 A1 | 7/2006 | Curello et al. |
| 2007/0145487 A1* | 6/2007 | Kavalieros ........ H01L 29/66628 257/368 |
| 2008/0237634 A1 | 10/2008 | Dyer et al. |
| 2008/0299724 A1* | 12/2008 | Grudowski ....... H01L 29/66628 438/257 |
| 2009/0068810 A1 | 3/2009 | Tsai et al. |

(Continued)

FOREIGN PATENT DOCUMENTS

| | | |
|---|---|---|
| CN | 101414632 A | 4/2009 |
| CN | 103165435 A | 6/2013 |

(Continued)

OTHER PUBLICATIONS

Office Action dated Nov. 18, 2015 from KIPO for corresponding application 10-2014-0164524.

(Continued)

*Primary Examiner* — Phuc Dang
(74) *Attorney, Agent, or Firm* — WPAT, P.C., Intellectual Property Attorneys; Anthony King

(57) ABSTRACT

In some embodiments, in a method, a body structure with a gate structure configured thereon is provided. The gate structure comprises a gate side wall traversing the body structure. A spacer is formed over the gate side wall. A first recess is formed in the body structure. The first recess is formed beside the spacer and extending laterally under the spacer. A recess extension is formed under the first recess to extend a vertical depth of the first recess. Stressor material with a lattice constant different from that of the body structure is grown such that the extended first recess is filled.

20 Claims, 23 Drawing Sheets

(56) References Cited

U.S. PATENT DOCUMENTS

| | | | |
|---|---|---|---|
| 2009/0280627 A1* | 11/2009 | Pal | H01L 21/26506 438/504 |
| 2011/0079829 A1 | 4/2011 | Lai et al. | |
| 2011/0133292 A1 | 6/2011 | Lee et al. | |
| 2011/0223735 A1 | 9/2011 | Yu et al. | |
| 2012/0012932 A1 | 1/2012 | Perng et al. | |
| 2012/0100681 A1* | 4/2012 | Fang | H01L 21/02057 438/269 |
| 2012/0153387 A1* | 6/2012 | Murthy | H01L 21/28512 257/335 |
| 2012/0261718 A1 | 10/2012 | Sosa Cortes et al. | |
| 2013/0049068 A1 | 2/2013 | Lin et al. | |
| 2013/0089959 A1 | 4/2013 | Kwok et al. | |
| 2013/0217204 A1 | 8/2013 | Park | |
| 2014/0197455 A1* | 7/2014 | Lee | H01L 29/78 257/192 |

FOREIGN PATENT DOCUMENTS

| | | |
|---|---|---|
| JP | 2009-200225 A | 9/2009 |
| JP | 2009200225 A | 9/2009 |
| JP | 2011-119724 | 6/2011 |
| KR | 10-2006-0076150 | 7/2006 |
| KR | 20070089751 A | 8/2007 |
| KR | 10-2011-0036505 | 4/2011 |
| KR | 20120086369 | 8/2012 |
| KR | 20120098843 | 9/2012 |
| TW | 200919726 A | 3/2008 |
| TW | 201114039 A | 9/2008 |
| TW | 201203550 A | 1/2012 |

OTHER PUBLICATIONS

English translation of the Office Action dated Nov. 18, 2015 from KIPO for corresponding application 10-2014-0164524.
KR10-2011-0036505 corresponds to US20110079829.
JP2011-119724 corresponds to US20110133292.
Office Action from Korean Intellectual Property Office for corresponding application 10-2014-0161081 dated Oct. 28, 2015.
English translation of the Office Action from Korean Intellectual Property Office for corresponding application dated Oct. 28, 2015. 10-2014-0161081.
English abstract of JP2009-200225A.
US2006138398A1 corresponds to KR20060076150A.
Office Action dated May 18, 2016 from Taiwan Intellectual Property Office for corresponding application 103116787.
English abstract translation of TW 201203550 A.
Office Action dated Jun. 13, 2016 from Taiwan Intellectual Property Office for Taiwan application 103130341.
Search report dated Jun. 13, 2016 from Taiwan Intellectual Property Office for for Taiwan application 103130341.
Office Action dated May 10, 2016 from Korean Intellectual Property Office for corresponding application 10-2014-0164524.
English translation of the Office Action dated May 10, 2016 from Korean Intellectual Property Office for corresponding application 10-2014-0164524.
Office Action dated Mar. 3, 2016 from Taiwan Intellectual Property Office for corresponding application 103130341.
English abstract of TW 200919726 A.
English abstract of TW 201114039 A.
Notice of Allowance dated Jul. 5, 2016 from Korean Intellectual Property Office for Korean application 10-2014-0161081.
English translation of the Notice of Allowance dated Jul. 5, 2016 from Korean Intellectual Property Office for Korean application 10-2014-0161081.
US20060145273A1 corresponds to KR20070089751A.
English abstract translation of KR20120098843.
English abstract translation of KR20120086369.
Notice of allowance dated Mar. 8, 2017 from Korean Intellectual Property Office for application No. 10-2016-0119535, with english translation.
German office action dated Oct. 12, 2017, which cites US20080237634, US20120261718, US20130089959.
Office action for patent No. 201410352654.0 from the Chinese patent office dated May 3, 2017.
Office action dated Jun. 2, 2017 for corresponding China application 201410770302.7.
China office action dated Jan. 3, 2018 from corresponding China application 201410352654.0.
Abstract translation of CN103165435A.
German office action dated Oct. 5, 2018 from related German application 10 2014 019 190.7.
Abstract translation of JP2009200225A.

* cited by examiner

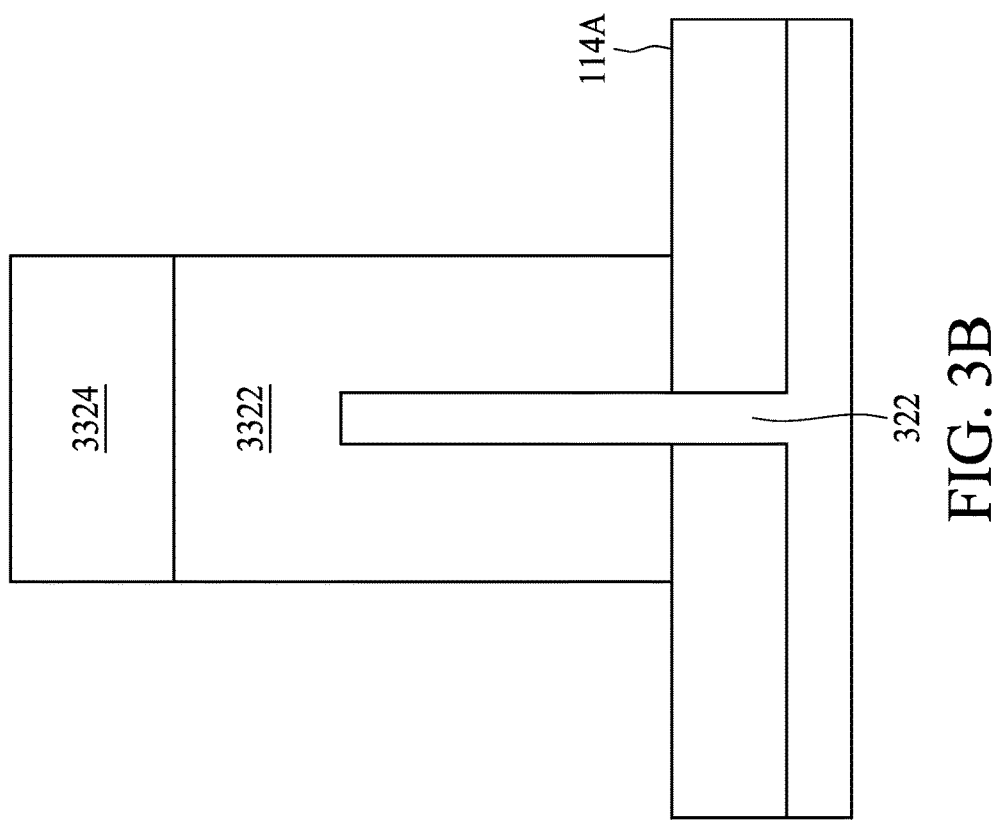

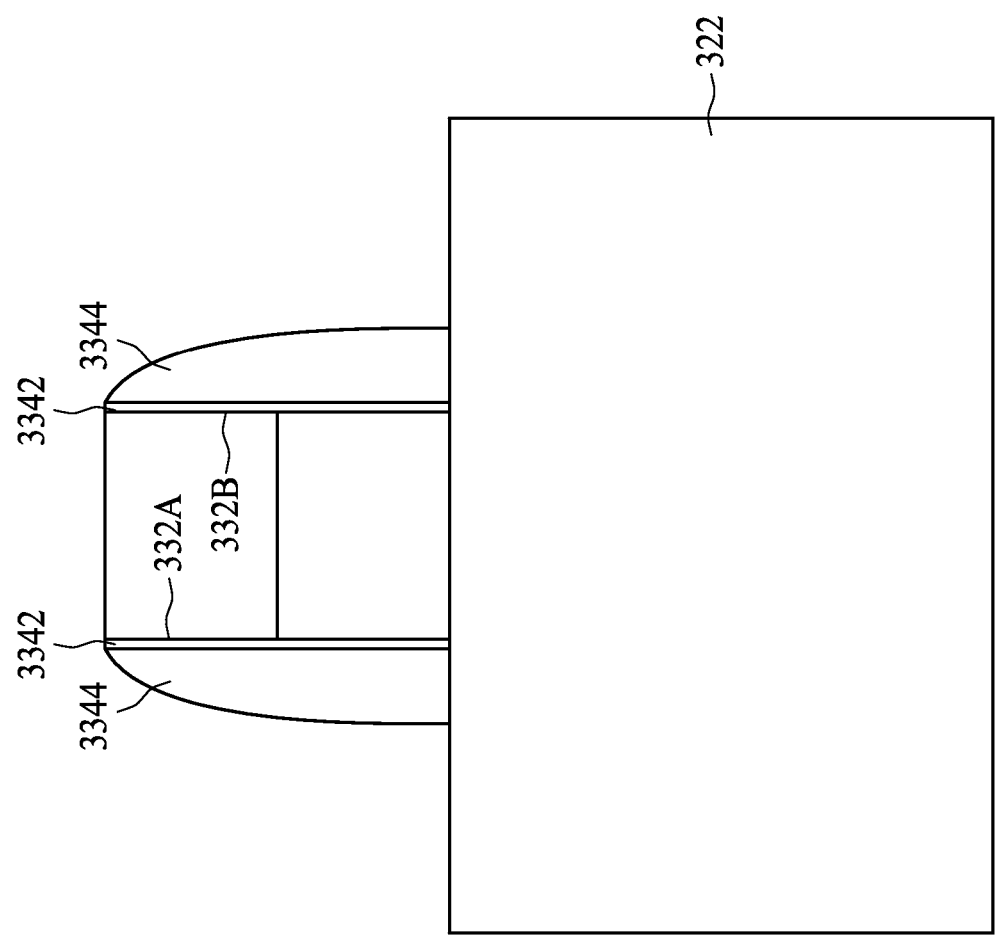

EMBEDDED SOURCE OR DRAIN REGION OF TRANSISTOR WITH LATERALLY EXTENDED PORTION

TECHNICAL FIELD

The present disclosure is generally related to an embedded source or drain region of a transistor with a laterally extended portion.

BACKGROUND

Field effect transistors (FETs) introduced with mechanical stress applied to channel regions have enhanced driving strength due to increased carrier mobility in the channel regions. In some approaches, in an FET, source and drain regions on opposite sides of a gate include stressor regions embedded in a body structure. Lattice mismatch between the material of a channel region and the material of the embedded stressor regions causes mechanical stress applied to the channel region. The magnitude of the mechanical stress is dependent on the proximity of the embedded stressor regions to the channel region, and the volumes of the embedded stressor regions. However, when forming recesses in the body of the FET in which the stressor material is to be grown, the profiles of the recesses is dependent on a loading effect of neighboring geometry which can vary from a FET to FET, thereby resulting in non-uniformity of device performance.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

FIGS. 3B and 3C are a schematic cross-sectional diagrams along a line C-C' and a line D-D' in FIG. 3A in accordance with some embodiments.

FIG. 4 is a schematic cross-sectional diagram illustrating spacers formed over the gate side walls in accordance with some embodiments.

Like reference symbols in the various drawings indicate like elements.

DETAIL DESCRIPTION

Figure 1A:
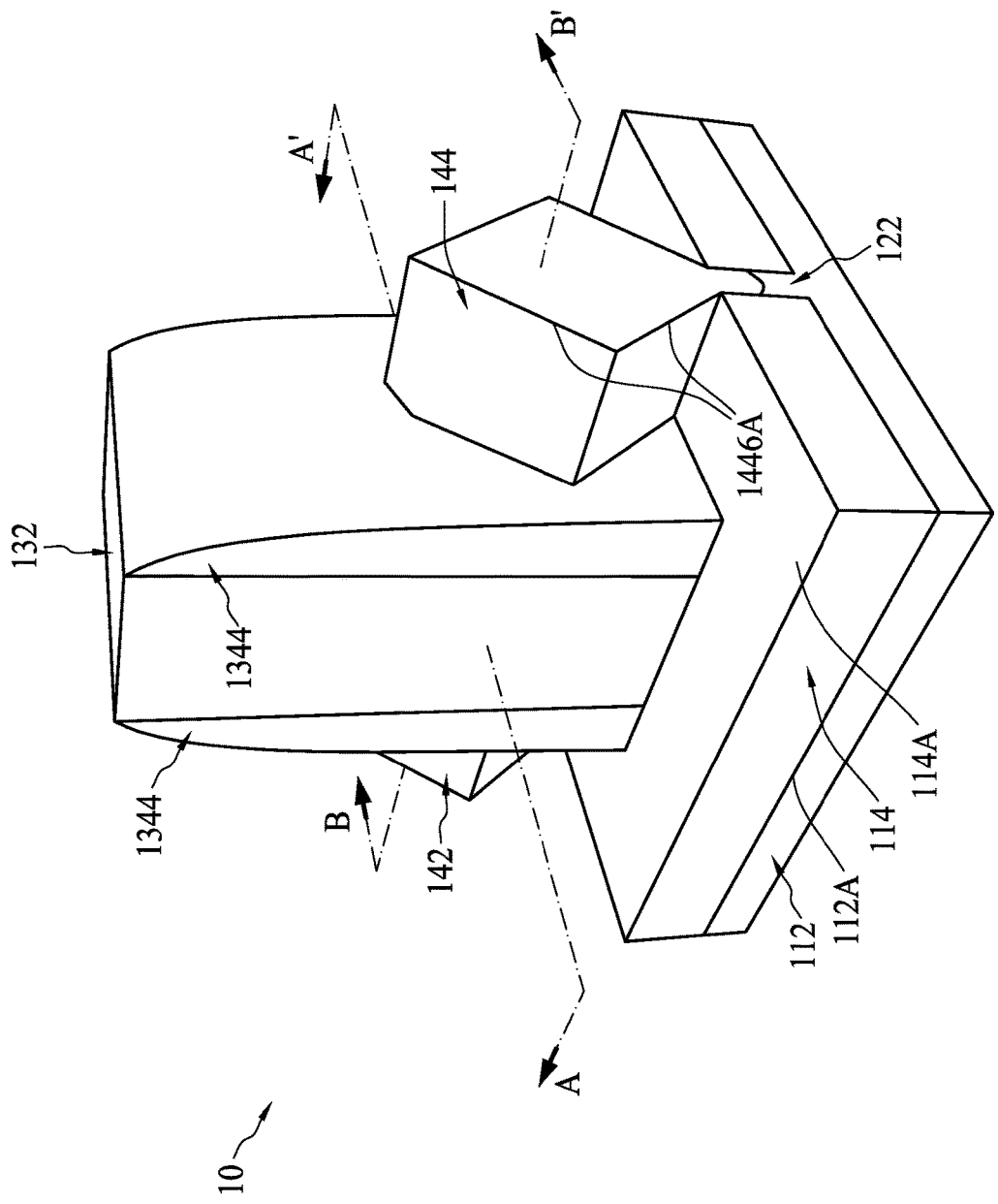
FIG. 1A is a schematic perspective diagram of a FinFET structure having source and drain regions containing epitaxially grown stressor material in accordance with some embodiments.

Embodiments, or examples, of the disclosure illustrated in the drawings are now described using specific languages. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numbers may be repeated throughout the embodiments, but this does not necessarily require that feature(s) of one embodiment apply to another embodiment, even if they share the same reference number. It will be understood that when a feature is "formed over" another feature or a substrate, intervening features may be present. Furthermore, the terms "top" and "bottom" and the like are used to describe a relative distance of a feature with respect to a surface of a substrate over which the feature is formed being larger and smaller, or under which the feature is formed being smaller and larger, respectively, and are not intended to limit the scope of the embodiments to any particular orientation.

Some embodiments have one or a combination of the following features and/or advantages. In some embodiments, a source or drain region with stressor material to create mechanical stress to a channel region has a first region and a second region embedded in a body structure. The first region extended laterally under a spacer by a gate structure. The second region extends a vertical depth of the first region. In some embodiments, a recess in which the first region is formed is created by a process less susceptible to loading effects. A recess extension in which the second region is formed is created by a process more optimized with respect to reaching the total vertical depth for a desired volume of the source or drain region. Therefore, a proximity of the source or drain region to the channel region is enhanced and is more stable. Further, the process for producing the desired total vertical depth can be optimized separately from the process for controlling the proximity of the source or drain region to the channel region.

Figure 1B:
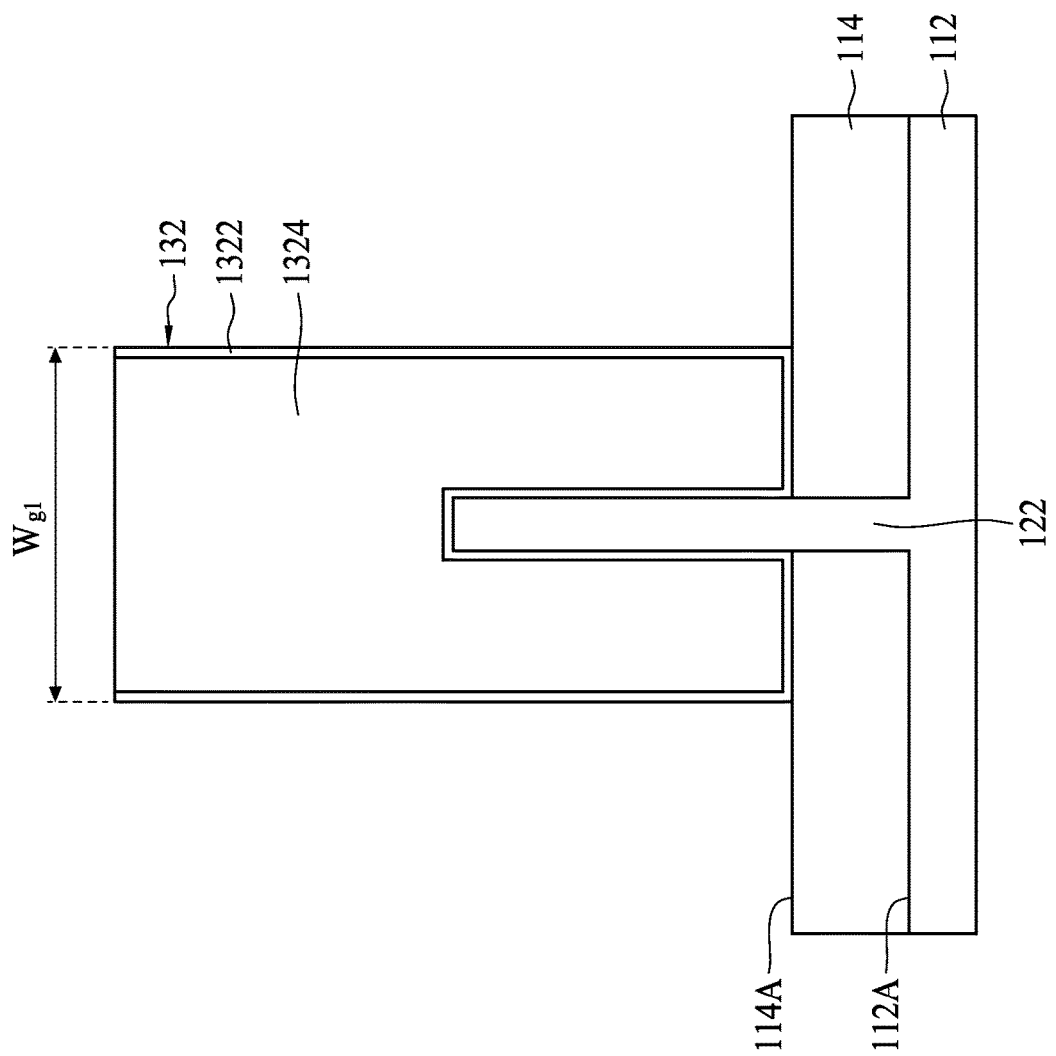
FIGS. 1B and 1C are schematic cross-sectional diagrams along a line A-A' and a line B-B' in FIG. 1A, respectively, in accordance with some embodiments.
Figure 1C:
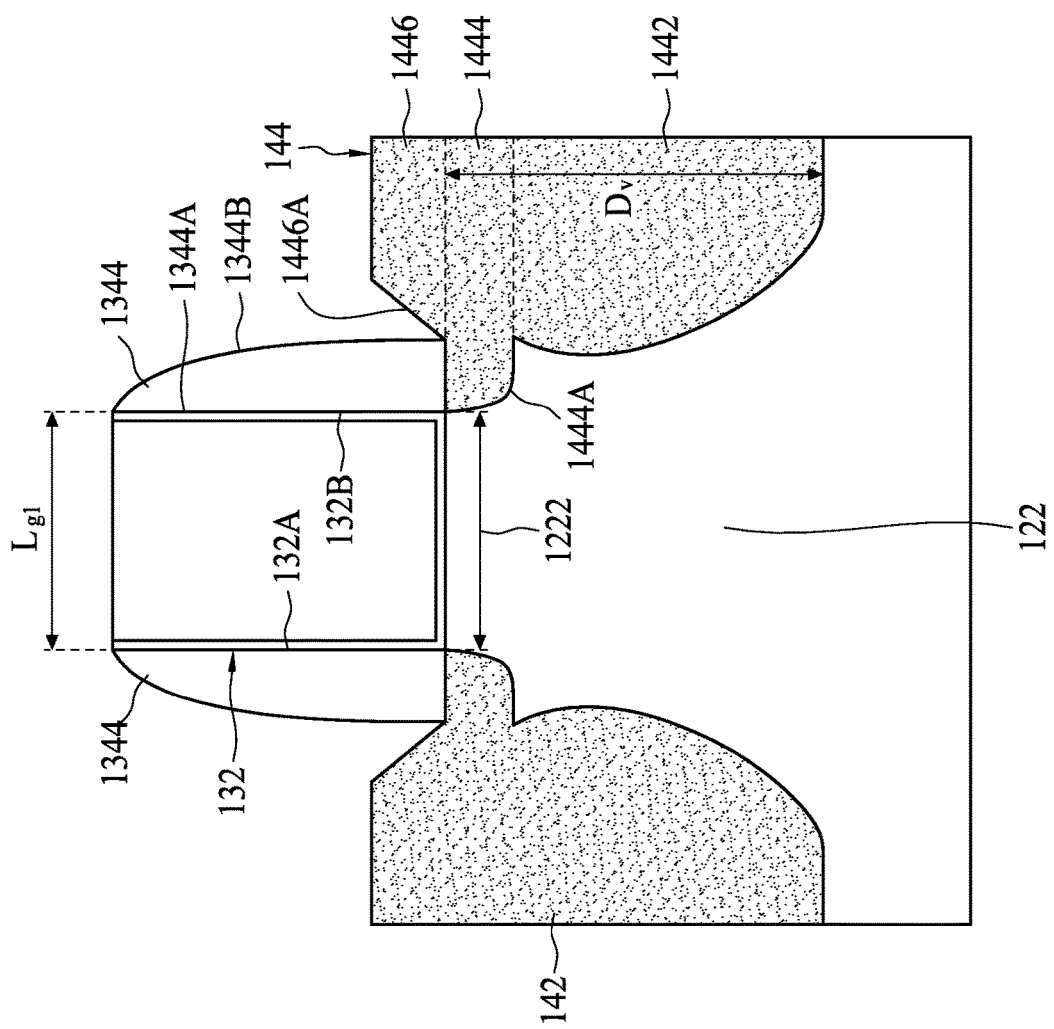

FIG. 1A is a schematic perspective diagram of a FinFET structure 10 having source and drain regions 142 and 144 containing epitaxially grown stressor material in accordance with some embodiments. FIGS. 1B and 1C are schematic cross-sectional diagrams along a line A-A' and a line B-B' in FIG. 1A, respectively, in accordance with some embodiments. FIG. 1A illustrates relative orientations of the substrate 112, a body structure 122, a gate structure 132 and the source and drain regions 142 and 144 in the FinFET structure 10. FIG. 1B illustrates the cross-section of the body structure 122 along a width $W_{g1}$ of the gate structure 132. FIG. 1C illustrates a cross-section of the source and drain regions 142 and 144 and the body structure 122 along a length $L_{g1}$ of the gate structure 132.

Referring to FIG. 1A, the FinFET structure 10 includes a substrate 112, the body structure 122, dielectric isolation regions 114, the gate structure 132 with spacers 1344, and source and drain regions 142 and 144. In some embodiments, the substrate 112 is a bulk semiconductor substrate in a crystalline structure, such as a bulk silicon substrate. The substrate 112 has a top surface 112A (labeled at the level of the top surface).

In some embodiments, the body structure 122 includes a fin structure protruding from the surface 112A of the substrate 112. Referring to FIG. 1B, in some embodiments, the cross section of the body structure 122 along the width $W_{g1}$ of the gate structure 132 has a vertical profile from the surface 112A to the top of the body structure 122. The vertical profile of the body structure 122 is exemplary. For example, the cross section of the body structure 122 along the width $W_{g1}$ of the gate structure 132 can have a tapered profile from the surface 112A to the top surfaces 114A of the dielectric isolation region 114, or a tapered profile from the surface 112A to the top of the body structure 122. In some embodiments, the body structure 122 has the same material as the substrate 112 and has, for example, the crystalline structure of silicon.

Referring to FIG. 1A, in some embodiments, dielectric isolation regions 114 such as shallow trench isolations (STIs) are formed on the surface 112A of the substrate 112 and surrounding the body structure 122. The dielectric isolation regions 114 have top surfaces 114A. Referring to FIG. 1B, the body structure 122 extends above the top surfaces 114A of the dielectric isolation regions 114. In some embodiments, the dielectric isolation regions 114 includes silicon oxide, silicon nitride, silicon oxy-nitride, fluoride-doped silicate (FSG), and/or a suitable low-k dielectric material.

Referring to FIG. 1A, in some embodiments, the gate structure 132 is formed on the top surfaces 114A of the dielectric isolation regions 114 and traverses a portion of the body structure 122. Referring to FIG. 1B, along the width $W_{g1}$ of the gate structure 132, the gate structure 132 traverses the body structure 122 and wraps around the body structure 122. In some embodiments, the gate structure 132 includes a gate dielectric layer 1322 which wraps around the body structure 122 conformally, and a gate electrode 1324 that caps over the gate dielectric layer 1322. In some embodiments, the gate dielectric layer 1322 includes a high-k dielectric material such as $HfO_2$, HfErO, HfLaO, HfYO, HfGdO, HfAlO, HfZrO, HfTiO, HMO, $ZrO_2$, $Y_2O_3$, $La_2O_5$, $Gd_2O_5$, $TiO_2$, $Ta_2O_5$, SrTiO, or combinations thereof. In some embodiments, the gate electrode 1324 includes work function metal layers which are conformally formed over the gate dielectric layer 1322 for adjusting a work function of the gate electrode 1324, and a fill metal that caps over the work function metal layers serving as the main conductive portion of the gate electrode 1324. Examples of work function metal layers include TaC, TaN, TiN, TaAlN, TaSiN, and combinations thereof. Examples of fill metal includes W, Al, Cu, and combinations thereof. The layers in the gate structure 132 are exemplary. The gate structure 132 with, for example, other layers, other coverage of the layers, different numbers of the layers are within the contemplated scope of the present disclosure.

Referring to FIG. 1A, in some embodiments, the source and drain regions 142 and 144 on opposite sides of the gate structure 132 includes epitaxially grown stressor material. Referring to FIG. 1C, the gate structure 132 has opposite side walls 132A and 132B across the gate length $L_{g1}$ of the gate structure 132. The spacers 1344 are formed on the side walls 132A and 132B of the gate structure 132. The source and drain regions 142 and 144 are configured beside the spacers 1344 and have regions that are embedded in the body structure 122, such as a region 1442 and a region 1444, and a region beyond the body structure 122, such as regions 1446. In some embodiments, the region 1444 extends laterally under the spacer 1344, and the region 1442 is located under the region 1444 and extends the vertical depth of the region 1444 so that the region 1442 and the region 1444 has a total vertical depth $D_v$. In some embodiments, the region 1444 protrudes laterally from the region 1442. In some embodiments, the region 1444 of has a wall section 1444A under the spacer 1344. The wall section 1444A tapers towards a plane in the body structure 122 aligned with the gate side wall 132B from a bottom of the wall section 1444A to a top of the wall section 1444A. The bottom of the wall section 1444A is aligned or more closely aligned with a side wall 1344B of the spacer 1344, and the top of the wall section 1444A is aligned or more closely aligned with a side wall 1344A of the spacer 1344. In the embodiments illustrated in FIG. 1C, the side wall 1344A of the spacer 1344 coincide with the gate side wall 132B. In other embodiments to be described with reference to FIG. 5, the side wall 3344A of the spacer 3344 does not coincide with the gate side wall 332B. The plane in the body structure 122 aligned with the gate side wall 132B is considered as one end of a channel region 1222 under the gate structure 132. In some embodiments, the wall section 1444A has a round profile. In some embodiments, the region 1442 has an elliptical-shaped profile. In some embodiments, the region 1446 beyond the body structure 122 have facets 1446A (also labeled in FIG. 1A). In the beginning of the epitaxial growth of the source and drain regions 142 and 144, facets may not be fully established. However, with the proceeding of the epitaxial growth, due to different epitaxial growth rates on different surface planes, facets are gradually formed.

In some embodiments, the stressor material grown in the source and drain regions 142 and 144 has a lattice constant different from that of the body structure 122. In some embodiments, the FinFET structure 10 (labeled in FIG. 1A) is a p-type FET, and the stressor material grown in the source and drain regions 142 and 144 has a lattice constant larger than that of the body structure 122 to apply a compressive stress on the channel region 1222 in the body structure 122. In some embodiments, the body structure 122 is made of silicon (Si), and the stressor material is silicon germanium (SiGe). In other embodiments, the FinFET structure 10 is an n-type FET, and the stressor material grown in the source and drain regions 142 and 144 has a lattice constant smaller than that of the body structure 122 to apply a tensile stress on the channel region 1222 in the body structure 122. In some embodiments, the body structure 122 is made of Si, and the stressor material is silicon phosphide (Si:P) or silicon carbide (Si:C).

A distance between, for example, the source or drain region 144 embedded in the body structure 122 and the gate side wall 132B is defined as a proximity of the source or drain region 144 to the channel region 1222 under the gate structure 132. The closer the proximity of the source or drain region 144 to the channel region 1222 is, the greater the mechanical stress to the channel region 1222 is, and the higher the carrier mobility enhancement is. By forming the region 1444 extended laterally under the spacer 1344, the proximity of the source or drain region 144 to the channel region 1222 under the gate structure 132 is improved. Further, the mechanical stress applied to the channel region 1222 is dependent on the volume of the source or drain region 144, which depends on the total vertical depth $D_v$ of the region 1442 and the region 1444. By forming distinct regions 1444 and 1442 for enhancing the proximity effect and the volume effect, respectively, the optimization of the processes for forming the regions 1444 and 1442 can be separated.

Figure 2:
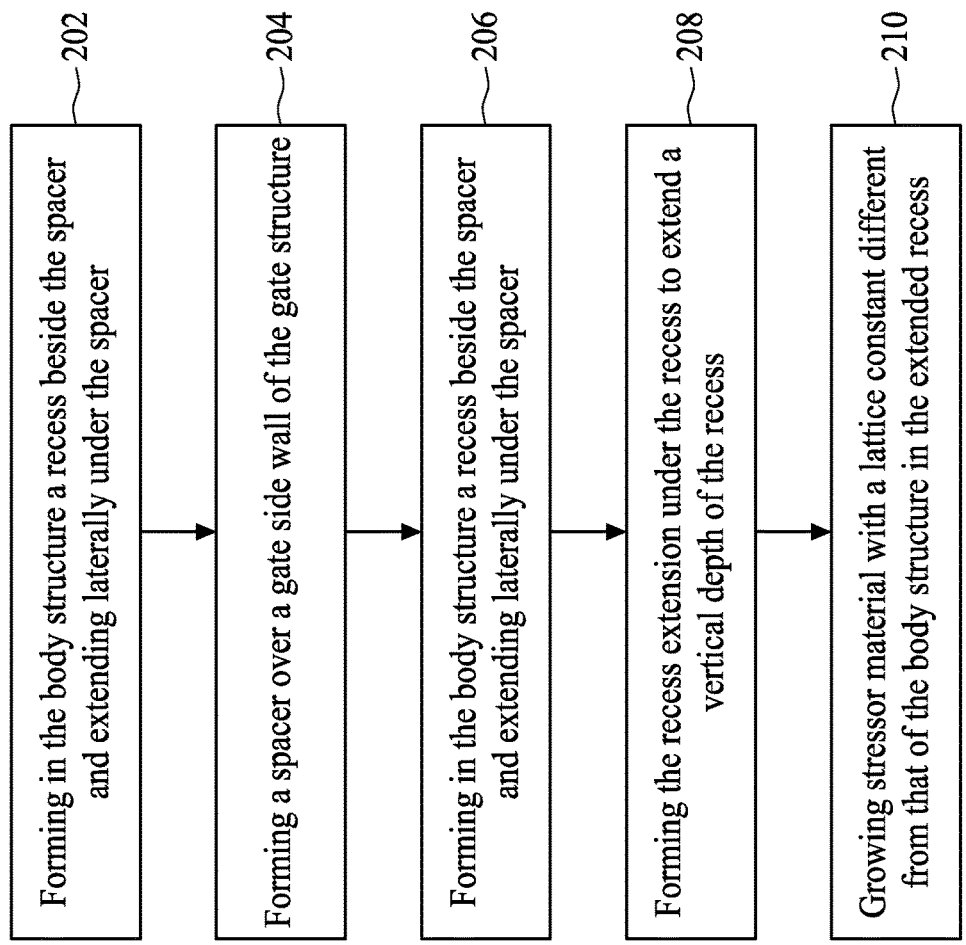
FIG. 2 is a flow chart of a method for forming an FET structure with source and drain regions containing epitaxially grown stressor material in accordance with some embodiments.

FIG. 2 is a flow chart of a method 200 for forming an FET structure with source and drain regions containing epitaxially grown stressor material in accordance with some embodiments. In operation 202, a body structure with a gate structure configured thereon is provided. In operation 204, a spacer is formed over a gate side wall of the gate structure. In operation 206, a recess beside the spacer and extending laterally under the spacer is formed in the body structure. In operation 208, a recess extension is formed under the recess to extend a vertical depth of the recess. In operation 210, stressor material with a lattice constant different from that of the body structure is grown in the extended recess.

FIGS. 3 to 11 are schematic diagrams illustrating semiconductor structures after each operation of a method for forming the FinFET structure 10 in FIG. 1A in accordance with some embodiments. The method illustrated in FIGS. 3 to 11 provides further details to the method described with reference to FIG. 2. In operation 202, a body structure with a gate structure configured thereon is provided. FIG. 3A is a schematic perspective diagram of a semiconductor structure 30 with a sacrificial gate structure 332 straddling a body structure 322 implemented as a fin in accordance with some embodiments. In some embodiments, the body structure 322 protruding from a surface 112A of a substrate 112 is formed by etching trenches in a bulk semiconductor substrate. The surface 112A is located at a level of the bottom surfaces of the trenches. Between the trenches is the body structure 322 extending from the surface 112A of the substrate 112. Further, the trenches are filled with dielectric material as described with references to FIGS. 1A and 1B to form the dielectric isolation regions 114. In some embodiments, the dielectric isolation regions 114 are further etched so that the body structure 322 extends beyond the top surfaces 114A of the dielectric isolation regions 114. In other embodiments, the portion of the body structure 122 extended beyond the top surfaces 114A of the dielectric isolation regions 114 is epitaxially grown.

Figure 3A:
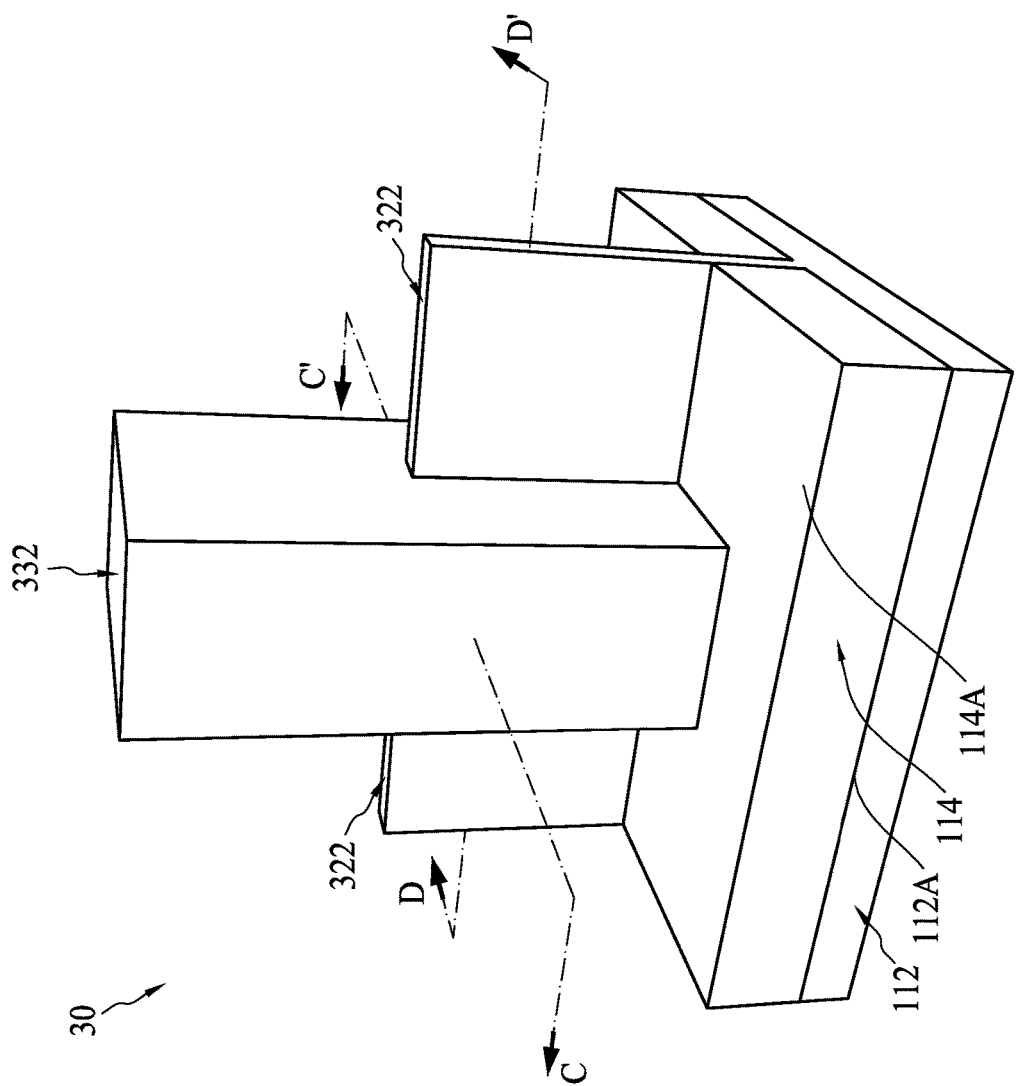
FIG. 3A is a schematic perspective diagram of a semiconductor structure with a sacrificial gate structure straddling a body structure implemented as a fin in accordance with some embodiments.
Figure 3C:
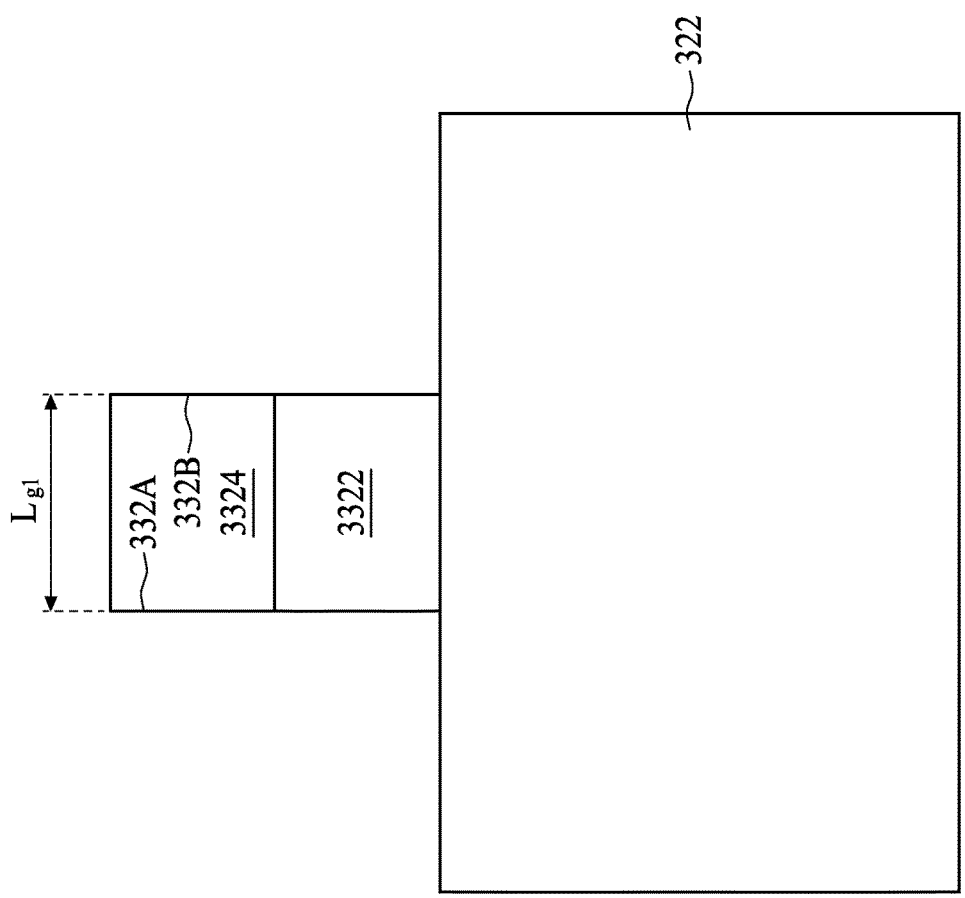

FIGS. 3B and 3C are a schematic cross-sectional diagrams along a line C-C' and a line D-D' in FIG. 3A in accordance with some embodiments. In some embodiments, for forming the sacrificial gate structure 332 straddling the body structure 322 in FIG. 3A, a sacrificial gate layer to be patterned into a sacrificial gate electrode 3322 illustrated in FIGS. 3B and 3C is blanket deposited over the surface 114A (shown in FIG. 3B) and a portion of the exposed surfaces of the body structure 322 (shown in both FIGS. 3B and 3C). In other embodiments, a sacrificial gate dielectric layer (not shown) is formed between the sacrificial gate layer and the body structure 322 to protect the body structure 322 when the sacrificial gate layer is being patterned to form the sacrificial gate electrode 3322. Further, one or more hard mask layers are formed on the sacrificial gate layer, and a photoresist layer is formed on the one or more hard mask layers. The layers for forming the sacrificial gate structure 332 can be deposited using any of the methods such as physical vapor deposition (PVD), plasma-enhanced chemical vapor deposition (PECVD), chemical vapor deposition (CVD), atomic layer deposition (ALD) or other methods deemed appropriate by those skilled in the art. Photolithography techniques are used to pattern the photoresist layer into a photoresist mask which defines an area where the sacrificial gate structure 332 (labeled in FIG. 3A) is desired. The area of the sacrificial gate structure 332 has a gate width $W_{g1}$ (shown n FIG. 3B) and a gate length $L_{g1}$ (shown in FIG. 3C). The pattern of the photoresist mask is then transferred to the one or more hard mask layers to form the hard mask 3324 (shown in both FIGS. 3B and 3C) which will not be significantly etched or eroded during patterning the sacrificial gate layer. Further, the pattern of the hard mask 3324 is transferred to the sacrificial gate layer to form a sacrificial gate electrode 3322. The transferring of the pattern from the photoresist mask to the underlying layers is performed by anisotropic etching using suitable etching gases. Referring to FIG. 3C, the sacrificial gate structure 332 has vertical gate side walls 332A and 332B across the gate length $L_{g1}$. In some embodiments, the sacrificial gate electrode 3322 is formed of polysilicon, and the hard mask 3324 includes $SiO_2$, $Si_3N_4$, or SiON. In other embodiments, the sacrificial gate electrode 3322 is formed of $Si_3N_4$ and the hard mask 3324 includes $SiO_2$, or SiON.

FIGS. 4 to FIG. 11 are cross-sectional diagrams along the gate length $L_{g1}$ (labeled in FIG. 3C). In operation 204, a spacer is formed over a gate side wall of the gate structure. FIG. 4 illustrates spacers 3344 formed over the gate side walls 332A and 332B in accordance with some embodiments. In some embodiments, a sealing layer 3342 is formed on gate side walls, including the gate side walls 332A and 332B, surrounding the sacrificial gate structure 332 (labeled in FIG. 3A). The sealing layer 3342 protects the sacrificial gate structure 332 from damage or loss during subsequent processing. In some embodiments, the sealing layer includes $Si_3N_4$. Subsequently, in some embodiments, the spacers 3344 are formed on the sealing layer 3342. The spacers 3344 are used to control the offsets of the source and drain regions 142 and 144 (shown in FIG. 1C) to the sacrificial gate structure 332 in order to obtain device performance without production issues. Each spacer 3344 can include one or more layers. In some embodiments, the spacers 3344 includes $Si_3N_4$, SiON, SiOCN, SiCN, or $SiO_2$. The sealing layer 3342 and the spacers 3344 can be deposited using any of the methods such as PVD, PECVD, CVD, ALD or other methods deemed appropriate by those skilled in the art. In other embodiments as illustrated in FIG. 1, the sealing layer 3342 is not formed, and the spacers 1344 also serve to seal the gate structure 132.

Figure 6:
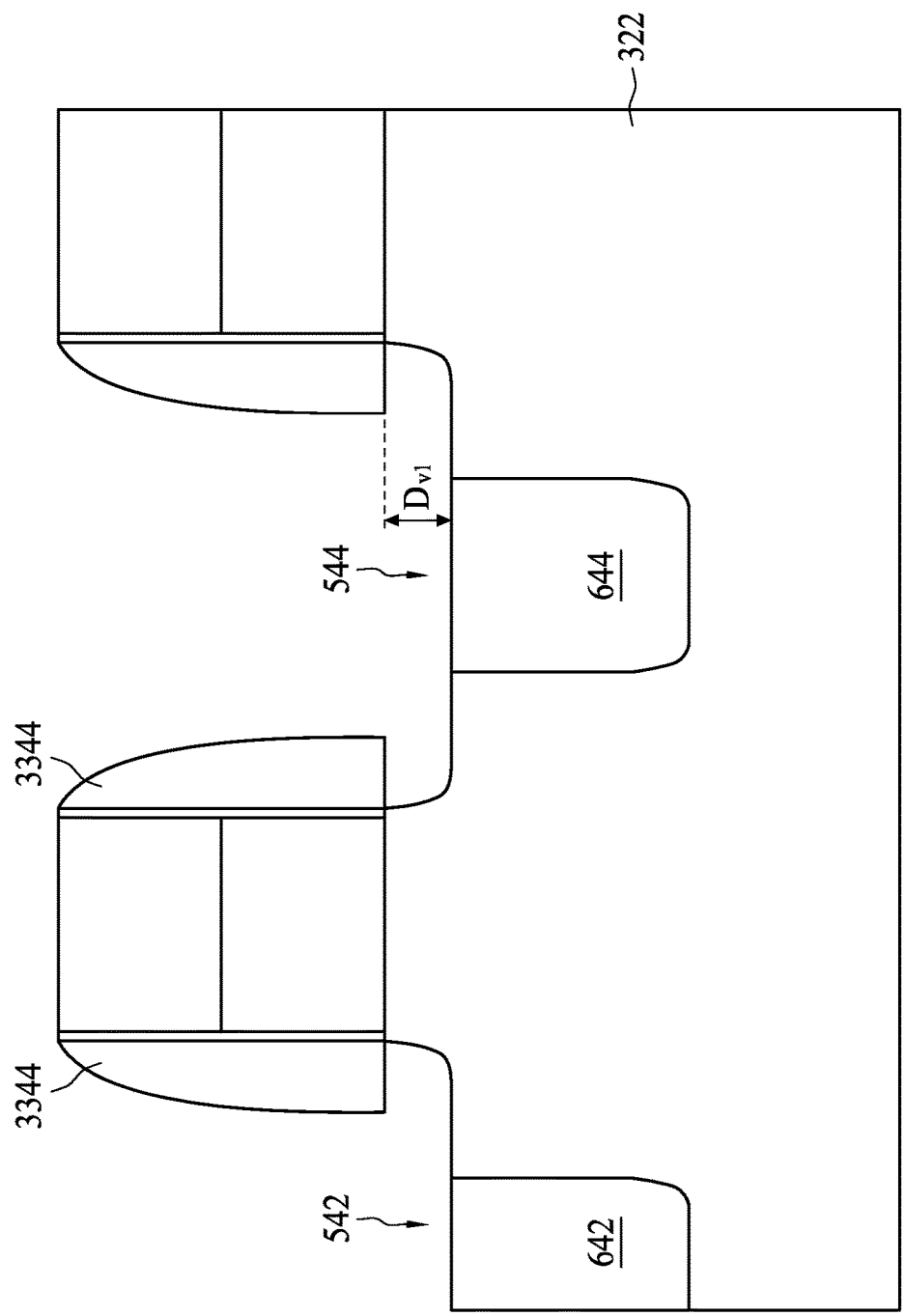
Figure 7:
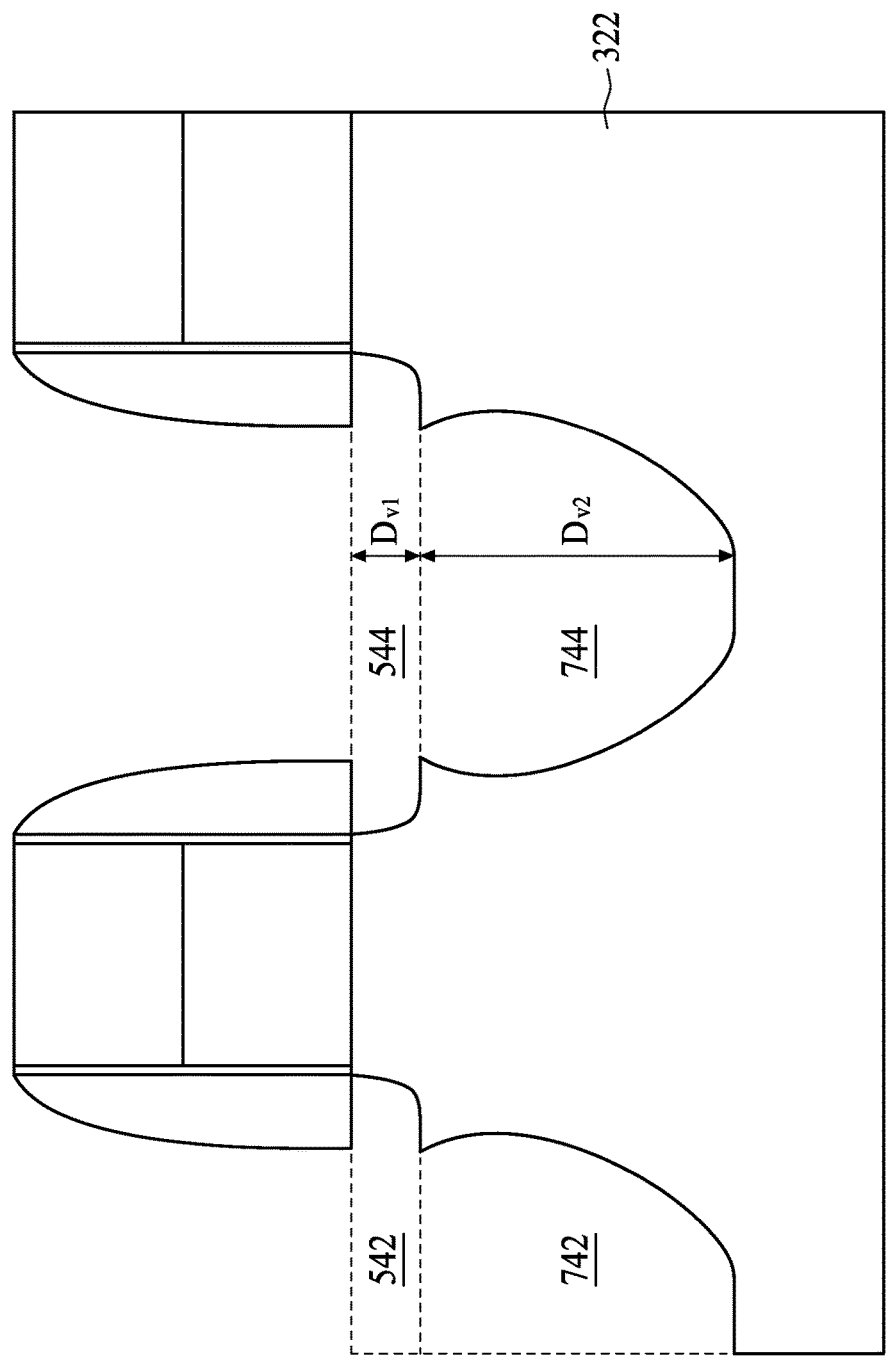
Figure 8:
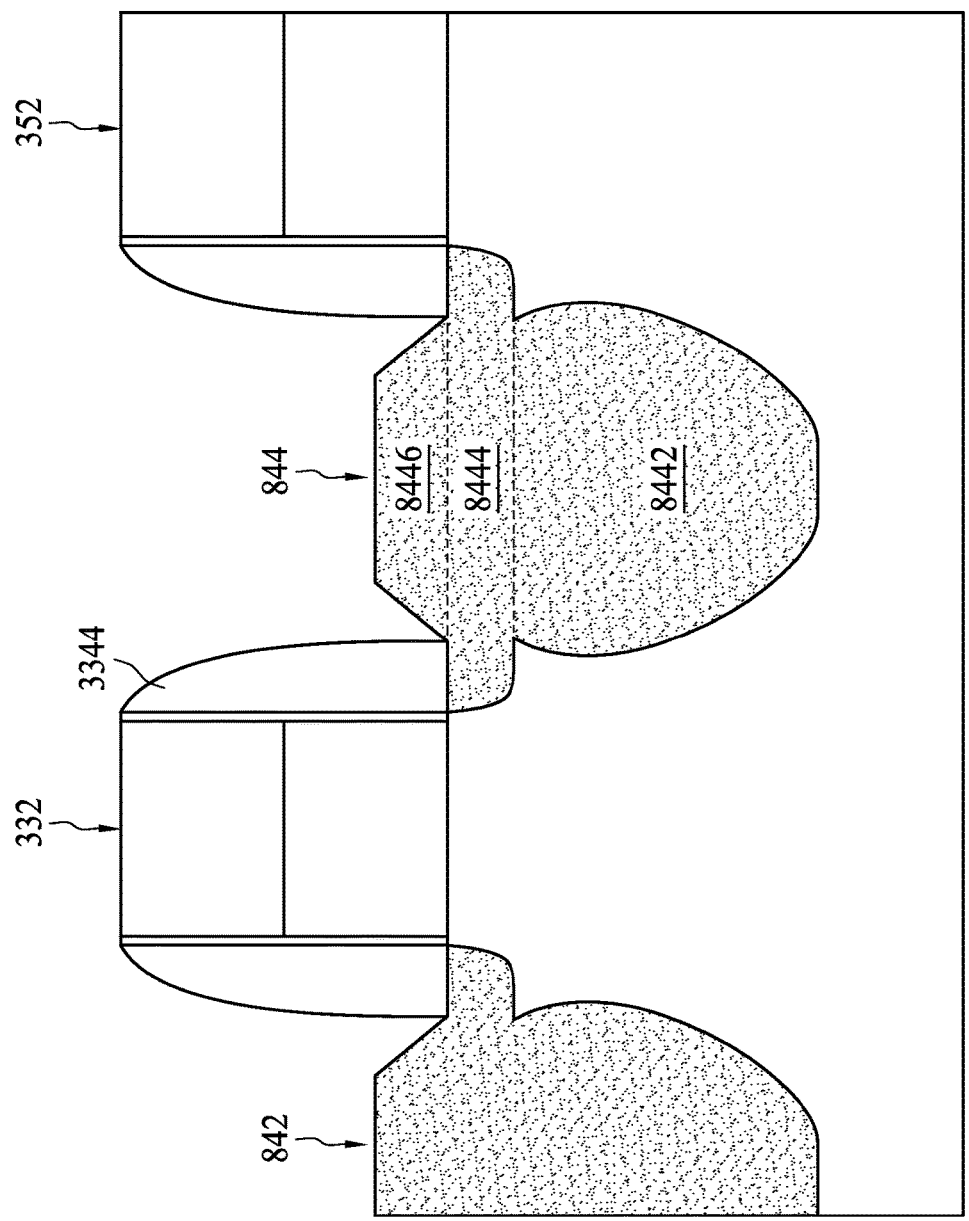

In some embodiments, the sacrificial gate structure 332 has a shared source or drain region 844 with an adjacent gate structure 352, as illustrated in FIG. 8. FIGS. 5 to 8 illustrate the formation of the source or drain region 842 and the shared source or drain region 844 in accordance with some embodiments. Because the formation of the shared source or drain region 844 is dependent on both the sacrificial gate structure 332 and the adjacent gate structure 352, the shared source or drain region 844 has a symmetrical profile. Nevertheless, the operations described with reference to FIGS. 5 to 8 are also applicable to the formation of the FinFET structure 10 illustrated in FIG. 1. Moreover, the semiconductor structure with source and drain regions with asymmetrical profiles as illustrated in FIG. 1, and with one or both of the source and drain regions with symmetrical profiles as illustrated in FIG. 8 are within the contemplated scope of the present disclosure.

Figure 5:
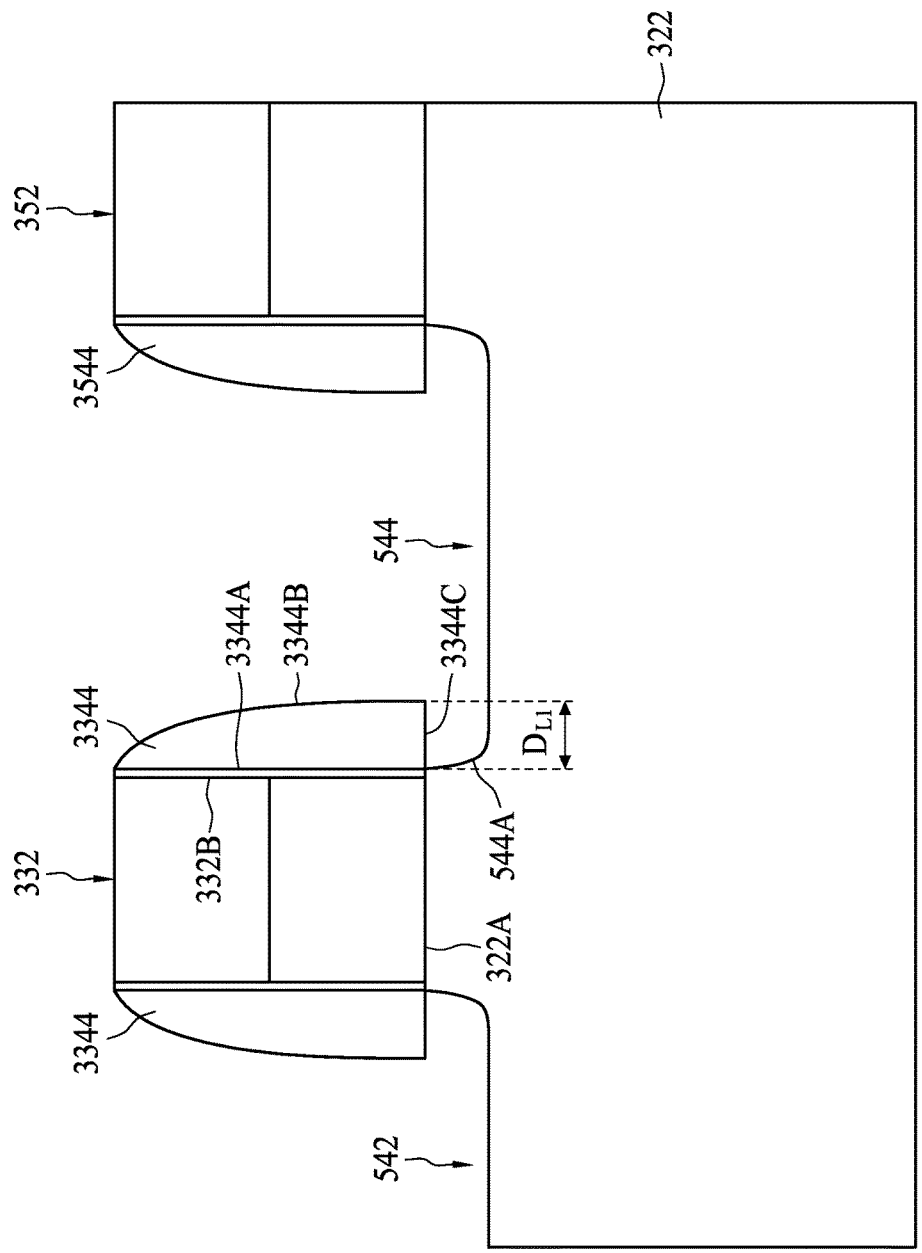
FIGS. 5 to 8 are schematic cross-sectional diagrams illustrating the formation of the source or drain region and the shared source or drain region in accordance with some embodiments.

In operation 206, a recess beside the spacer and extending laterally under the spacer is formed in the body structure. Referring to FIG. 5, in some embodiments, recesses 542 and 544 are formed in the body structure 322 beside the spacers 3344. The recesses 542 and 544 extend laterally under the spacers 3344. In some embodiments, the recess 544 is formed between the sacrificial gate structure 332 and the adjacent gate structure 352, and also extends laterally under the spacer 3544 of the gate structure 352.

In some embodiments, the recesses 542 and 544 are formed by isotropic etching. In some embodiments, wet etching is used to perform the isotropic etching. Because portions of the recesses 542 and 544 extended laterally under the spacers 3344 and 3544 are similar or symmetrical, the portion of the recess 544 extended laterally under the spacer 3344 is used as an example for characterizing the profile of the recesses 542 and 544. The recess 544 has a lateral depth $D_{L1}$ under the spacer 3344. In some embodiments, the lateral depth $D_{L1}$ is within a range of a first distance between a side wall 3344A and a side wall 3344B of the spacer 3344 at a level of a top surface 322A of the body structure 322, and a second distance between the side wall 3344A and the gate side wall 332B at the level of the top surface 322A. In some embodiments, a surface 3344C of the spacer 3344 on the body structure 322 is exposed. In the embodiments shown in FIG. 5, the lateral depth $D_{L1}$ extends up to the side wall 3344A of the spacer 3344. In other embodiments to be described with reference to FIG. 12, the lateral depth $D_{L2}$ further extends beyond the side wall 3344A and up to the gate side wall 332B. In the embodiments described with reference to FIG. 1C, because a sealing layer is not formed between the gate structure 132 and the spacer 1344, the lateral depth extends up to the side wall 1344A which coincides with the gate side wall 132B.

In some embodiments, the recess 544 has a wall section 544A under the spacer 3344. The wall section 544A tapers toward a plane in the body structure 322 aligned with the gate side wall 332B from a bottom of the wall section 544A to a top of the wall section 544A. The bottom of the wall section 544A is aligned or more closely aligned with the side wall 3344B of the spacer 3344, and the top of the wall section 3344A is aligned or more closely aligned with the side wall 3344A of the spacer 3344. In some embodiments, the wall section 544A under the surface 3344C exposed by the recess 544 tapers toward a plane in the body structure 322 aligned with the gate side wall 332B along a direction of exposure of the surface 3344C of the spacer 3344. The direction of exposure of the surface 3344C of the spacer 3344 is along the direction of lateral etching of the recess 544. In some embodiments, at the level of the top surface 322A of the body structure 322, the wall section 544A is located within a region between the surface 3344C of the spacer 3344 and the gate side wall 332B.

In operation 208, a recess extension is formed under the recess to extend a vertical depth of the recess. Referring to FIG. 6, in some embodiments, to extend a vertical depth $D_{v1}$ of the recesses 542 and 544, etch rate control doping regions 642 and 644 are formed in the body structure 322. The doping regions 642 and 644 are formed beside the spacers 3344 and under the recesses 542 and 544, respectively. A dopant used in forming the doping regions 642 and 644 is chosen based on its ability to increase the etch rate of the body structure 322. The specific dopant used depends on the material of the body structure 322 and an etchant used in a subsequent etching to form the recess extension. In some embodiments, the dopant is arsenic (As), phosphorous (P), or other suitable material. In some embodiments, ion implantation is used to perform doping. In some embodiments, As is used at a dosage that ranges from $1\times10^{14}$ to $5\times10^{15}$ atoms/cm$^3$. In some embodiments, As is used at a dosage of $3\times10^{14}$ atoms/cm$^3$. In some embodiments, As is implanted at an ion energy of 2 to 10 keV Referring to FIG. 7, in some embodiments, etching of the body structure 322 is performed to form the recess extensions 742 and 744 with a vertical depth $D_{v2}$ so that an extended recess including the recess 542 or 544 and the recess extension 742 or 744 has a total vertical depth of $D_{v1}+D_{v2}$. In some embodiments, the etching of the body structure 322 to form the recess extensions 742 and 744 uses etchants that complements the dopant used in the doping operation to increase the etch rate of the doping regions 642 and 644. Therefore, the vertical depth of the doping regions 642 and 644 control the vertical depth $D_{v2}$ of the recess extensions 742 and 744. In some embodiments, etching of the body structure 322 to form the recess extensions 742 and 744 is performed using dry chemical etching such as plasma etching. In some embodiments, the recess extension 744 has a symmetrical and elliptical-shaped profile. In other words, a vertical etch rate of the recess extension 744 is higher than a lateral etch rate of the recess extension 744. The recess extension 742 has an asymmetrical and elliptical-shaped profile. In some embodiments, the recess 542 or 544 protrudes laterally from the recess extension 742 or 744.

In operation 210, stressor material with a lattice constant different from that of the body structure is grown in the extended recesses. The extended recess includes the recess 542 or 544 and the recess extension 742 or 744 shown in FIG. 7. Referring to FIG. 8, in some embodiments, stressor material is grown in the extended recess and beyond the extended recess to form the source and drain regions 842 and 844. In some embodiments, the stressor material is grown using a selective epitaxial deposition process. In some embodiments, the source or drain region 844 has regions 8442 and 8444 that fill the extended recess, and a region 8446 extended beyond the extended recess. In accordance with the profile of the extended recess, the region 8444 extends laterally under the spacer 3344, and the region 8442 is located under the region 8444 and extends the vertical depth of the region 8444. The profile of the extended recess has been described with reference to FIG. 5. The profile of the region 8446 extended beyond the extended recess is similar to the region 1446 described with reference to FIG. 1C except the symmetry in profile resulted from the adjacent gate 352 described with reference to FIG. 5. The stressor material has been described with reference to FIG. 1A and is omitted here.

A proximity of the source or drain region 844 (shown in FIG. 8) to the gate side wall 332B is controlled by the lateral depth $D_{L1}$ of the recess 544 (shown in FIG. 5), and a volume of the source or drain region 844 is controlled by the vertical depth $D_{v2}$ of the recess extension 744 (shown in FIG. 7). By separating operations for forming the recess 542 or 544, and the recess extension 742 or 744, the loading effects that occur during, for example, dry etching of the body structure 322 to form the recess extension 742 or 744 does not affect the proximity of the source or drain region 842 or 844 that has been established during, for example, wet etching of the body structure 322 to form the recess 542 or 544. Therefore, the proximity of the source or drain region 842 or 844 is more stable and less susceptible to loading effects. Further, the optimization of the operations for forming the recess 542 or 544 and the recess extension 742 or 744 can be simplified since the operation for forming the recess 542 or 544 can be optimized with respect to a lateral etch rate, and the operation for forming the recess extension 742 or 744 can be optimized with a vertical etch rate.

Figure 9:
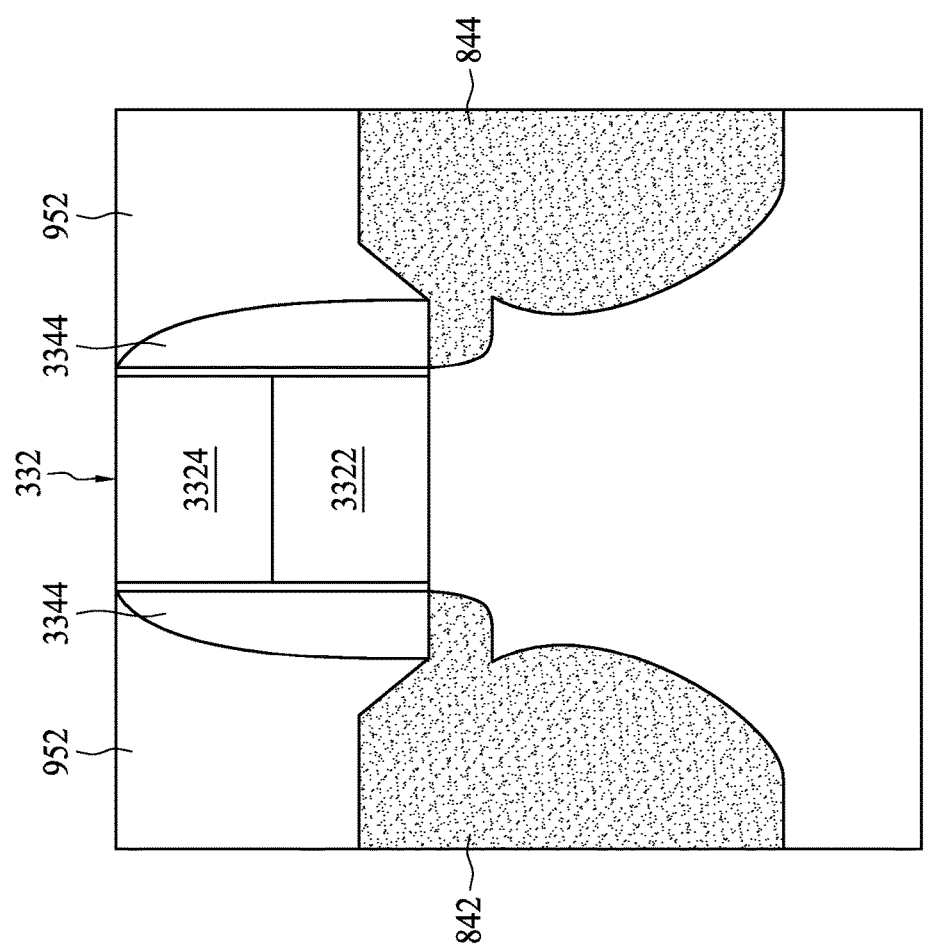
FIGS. 9 to 11 are schematic cross-sectional diagrams illustrating replacement of sacrificial gate materials with gate materials in accordance with some embodiments.
Figure 10:
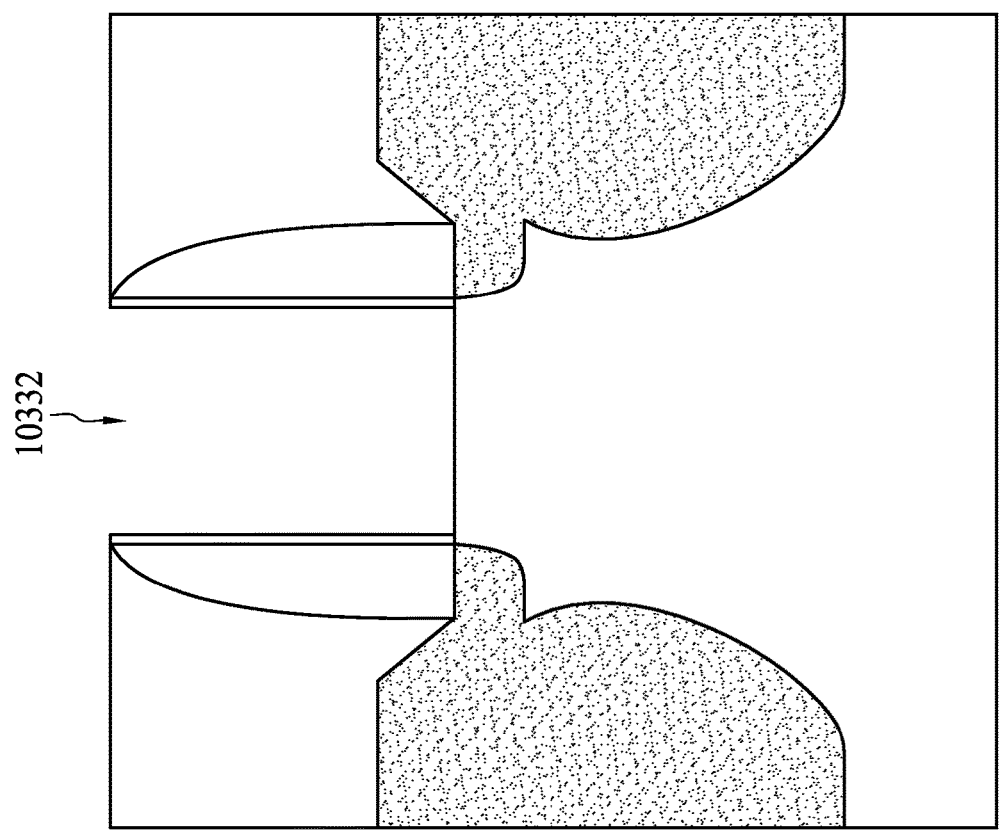
Figure 11:
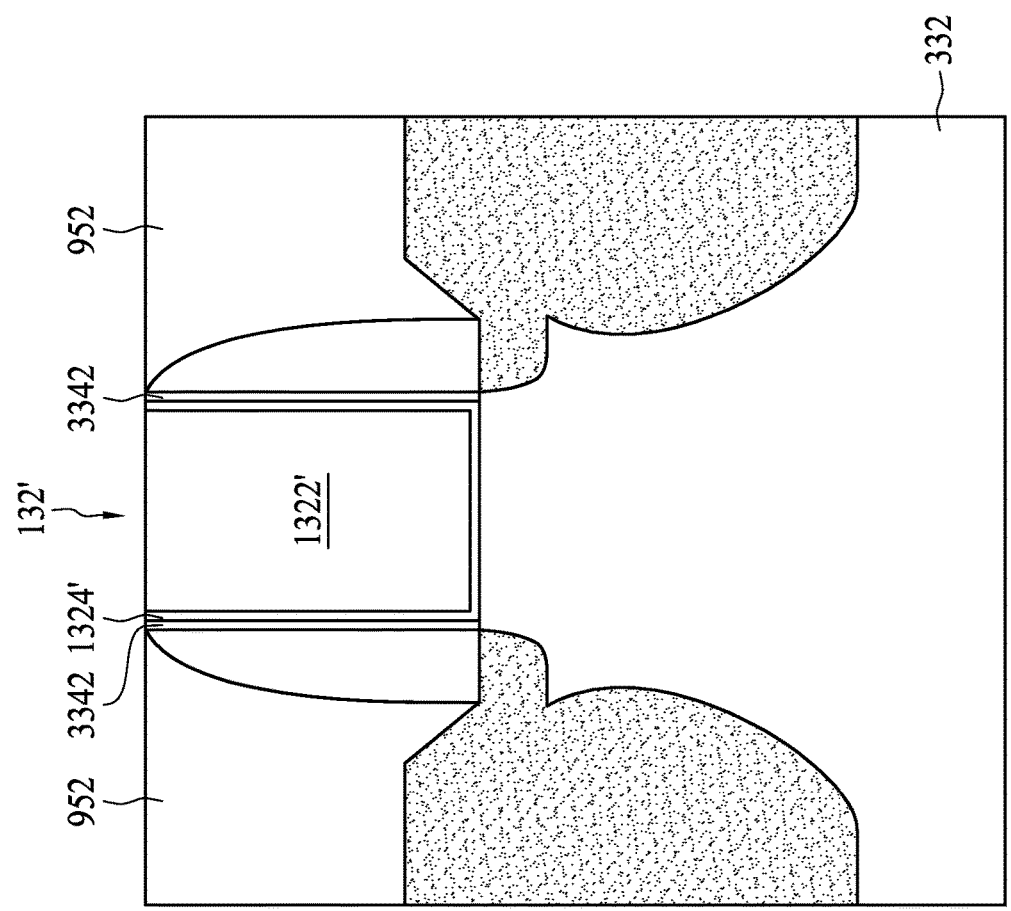

FIGS. 9 to 11 illustrate replacement of sacrificial gate materials with gate materials in accordance with some embodiments. For simplicity, the replacement for the adjacent gate structure 352 is not illustrated. Referring to FIG. 9, in some embodiments, an inter-layer dielectric (ILD) layer 952 surrounding the sacrificial gate structure 332 and abuts the spacers 3344 is formed. In some embodiments, the ILD layer 952 is blanket deposited over the surface 112A of the substrate 112 (labeled in FIG. 3A), and planarized until a top surface of the ILD layer 952 is planar the hard mask 3324. The ILD layer 952 is formed of a material whereby the sacrificial gate structure 332 can be removed without affecting the source or drain regions 842 and 844.

Referring to FIG. 10, in some embodiments, the hard mask 3324 and the sacrificial gate electrode 3322 shown in FIG. 9 are removed in sequence. Then, the patterned sacrificial gate dielectric layer, if exists, is removed. Removal of the hard mask 3324 and the sacrificial gate electrode 3322 exposes the underlying body structure 322 and forms an opening 10332 where the gate structure 132' will be formed.

Referring to FIG. 11, in some embodiments, the gate structure 132' is formed in the opening 10332 (shown in FIG. 10). In some embodiments, one or more gate dielectric layers such as a gate dielectric layer 1324' is conformally deposited on exposed surfaces of the body structure 332, and the sealing layer 3342. In other embodiments, the gate dielectric layer (not shown) is thermally grown on the exposed surfaces of the body structure 332. As described with reference to FIG. 1B, the gate dielectric layer 1324' includes a high-k dielectric material. The gate dielectric layer 1324' can be formed by, for example, CVD or ALD. Then the gate electrode 1322' filling the remaining portion of the opening 10322 is formed. In some embodiments, the gate electrode 1322' includes work function metal layers and fill metal. In some embodiments, the work function metal layers are conformally deposited over the gate dielectric layer 1324' using, for example, CVD or ALD. Then, the fill metal caps over the work function metal layers using, for example, CVD, ALD or sputtering. The fill metal is further planarized until a top surface of the gate electrode 1322' is planar the ILD layer 952. Exemplary materials for forming the work function metal layers and the fill metal have been described with reference to FIG. 1B and are omitted here.

The embodiments described with references to FIGS. 1A to 1C and the embodiments described with references to FIGS. 3A to 11 are with respect to the gate structures 132 and 132' formed with the replacement gate process. However, the present disclosure is not limited to the gate structures 132 and 132' formed using the replacement gate process. In some embodiments, a gate structure having the same profile as the gate structure 132 or 132' is formed by a non-replacement gate process and is formed before the formation of the recesses 542 and 544 shown in FIG. 5. Some embodiments for a non-replacement gate process are described with references to FIGS. 15 to 19.

Figure 12:
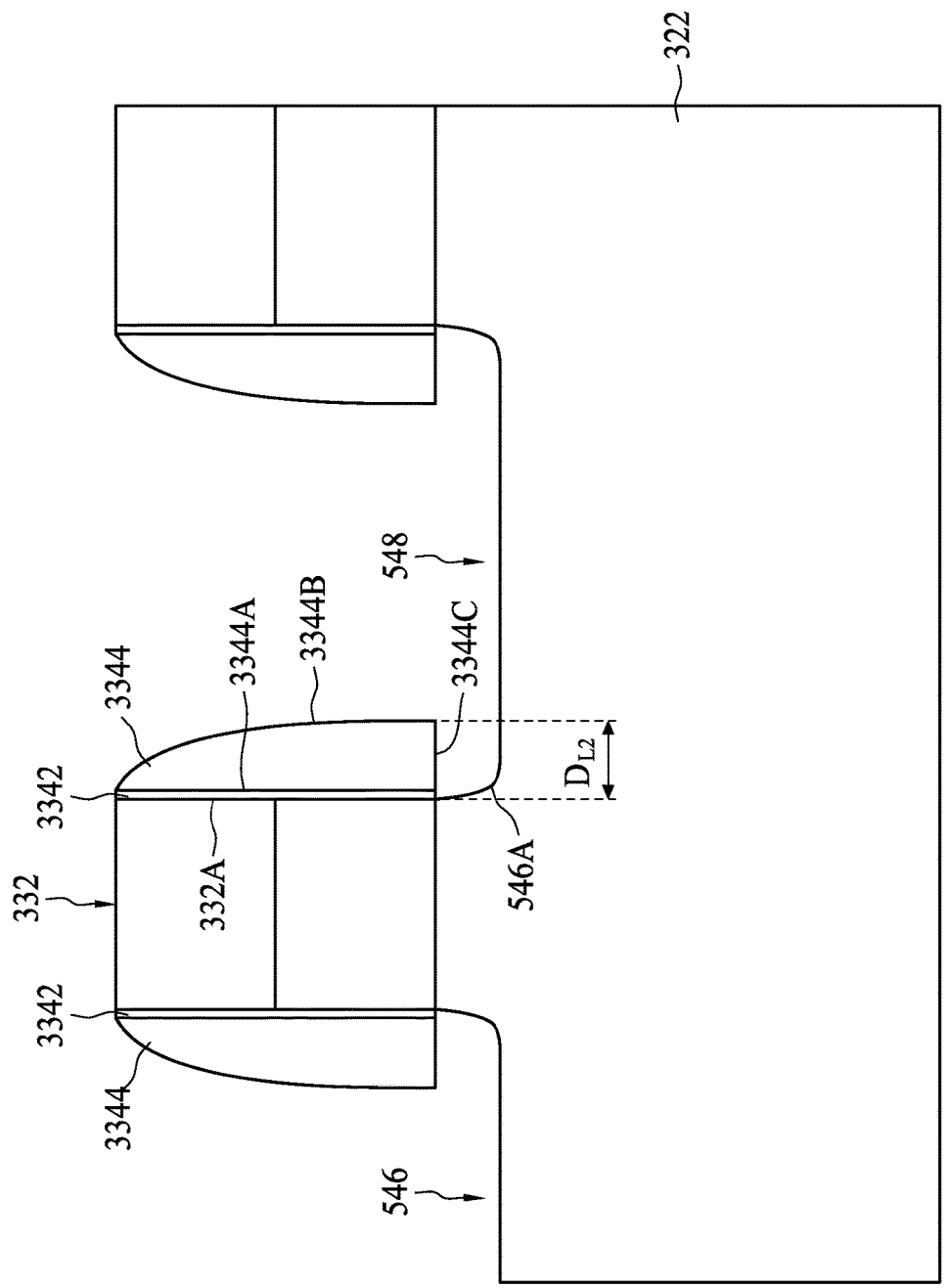
FIG. 12 is a schematic cross-sectional diagram of a semiconductor structure formed by the operation 206 described with reference to FIG. 2 in accordance with other embodiments.

FIG. 12 is a schematic cross-sectional diagram of a semiconductor structure formed by the operation 206 described with reference to FIG. 2 in accordance with other embodiments. The cross-sectional diagram in FIG. 12 is along the gate length $L_{g1}$ (labeled in FIG. 3C) of the sacrificial gate structure 332. Compared to the embodiments described with reference to FIG. 5, the recess 546 has a lateral depth $D_{L1}$ that extends up to the gate side wall 332B instead of the lateral depth $D_{L1}$ that extends up to the side wall 3344A of the spacer 3344. In some embodiments, in addition to the exposed surface 3344C of the spacer 3344 by the recess 546, a surface (not labeled) of the sealing layer 3342 beside the surface 3344C of the spacer 3344 is also exposed. Further, the recess 546 has a wall section 546A tapering toward a plane in the body structure 322 aligned with the gate side wall 332B from a portion of the wall section 546A corresponding to the side wall 3344B of the spacer 3344 to a portion of the wall section 546A corresponding to the gate side wall 332B. In some embodiments, the wall section 546A under the surface 3344C of the spacer 3344 and the surface of the sealing layer 3342 exposed by the recess 546 tapers toward a plane in the body structure 322 aligned with the gate side wall 332B along a direction of exposure of the surface 3344C of the spacer 3344 and the surface of the sealing layer 3342.

Figure 13:
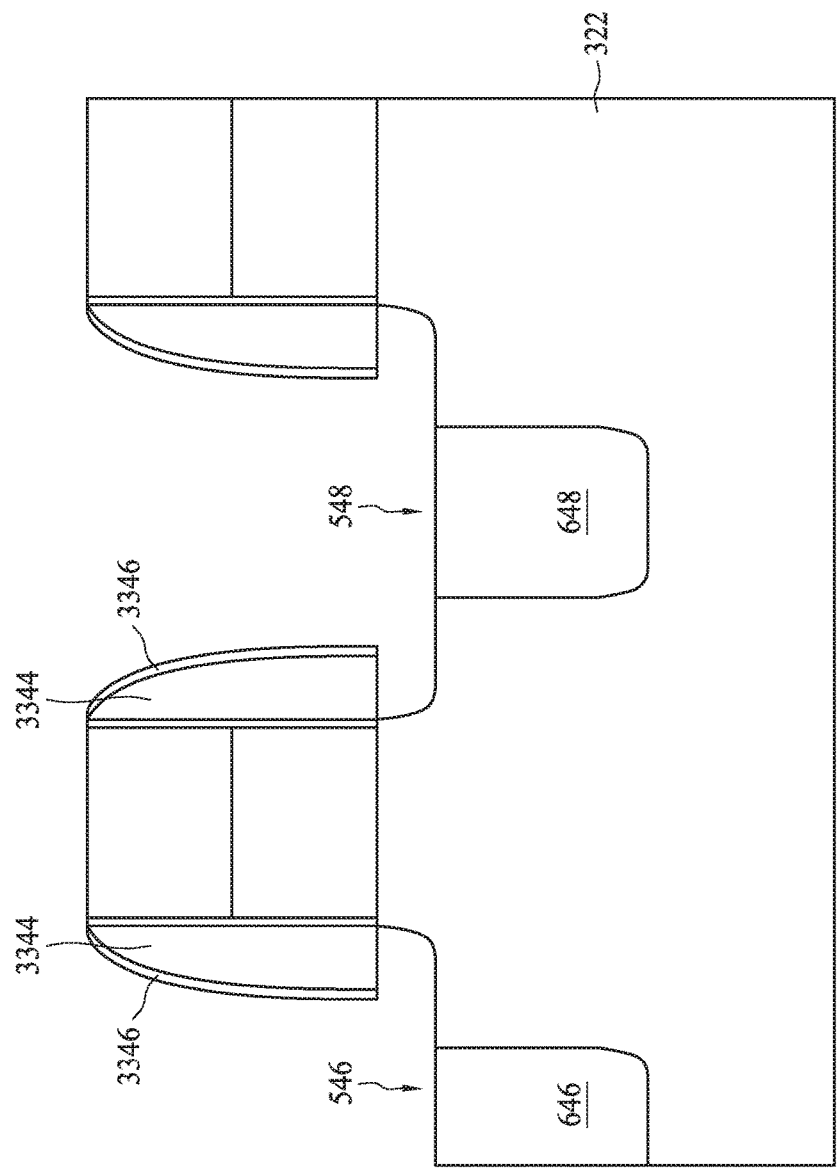
FIG. 13 is a schematic cross-sectional diagram of a semiconductor structure during the operation 208 described with reference to FIG. 2 in accordance with other embodiments.

FIG. 13 is a schematic cross-sectional diagram of a semiconductor structure during the operation 208 described with reference to FIG. 2 in accordance with other embodiments. The cross-sectional diagram in FIG. 13 is along the gate length $L_{g1}$ (labeled in FIG. 3C) of the sacrificial gate structure 332. Compared to the embodiments described with reference to FIG. 6, dummy spacers 3346 are further formed on the spacer 3344 before forming doping regions 646 and 648. In some embodiments, a refractory metal silicide layer is formed over the source and drain regions 842 and 844 (shown in FIG. 8). A semiconductor film layer such as a silicon film layer may be formed between the source and drain regions 842 and 844 and the silicide layer to, for example, provide enough silicon material to be used or consumed during the formation of a silicide layer. By forming the dummy spacers 3346, the gate structure 132' shown in FIG. 11 is shielded from possible silicide encroachment during forming the silicide layer to minimize the possibility of shortening of the gate structure 132'. In some embodiments, the dummy spacer 3346 includes $Si_3N_4$, SiOCN, SiON, SiCN, or $SiO_2$. In some embodiments, the dummy spacer 3346 is formed by any of the methods such as PVD, PECVD, CVD, ALD, or other methods deemed appropriate by those skilled in the art. In the embodiments illustratively shown in FIG. 13, the doping regions 646 and 648. Therefore the doping regions 642 and 646 are formed beside the dummy spacers 3346.

Figure 14:
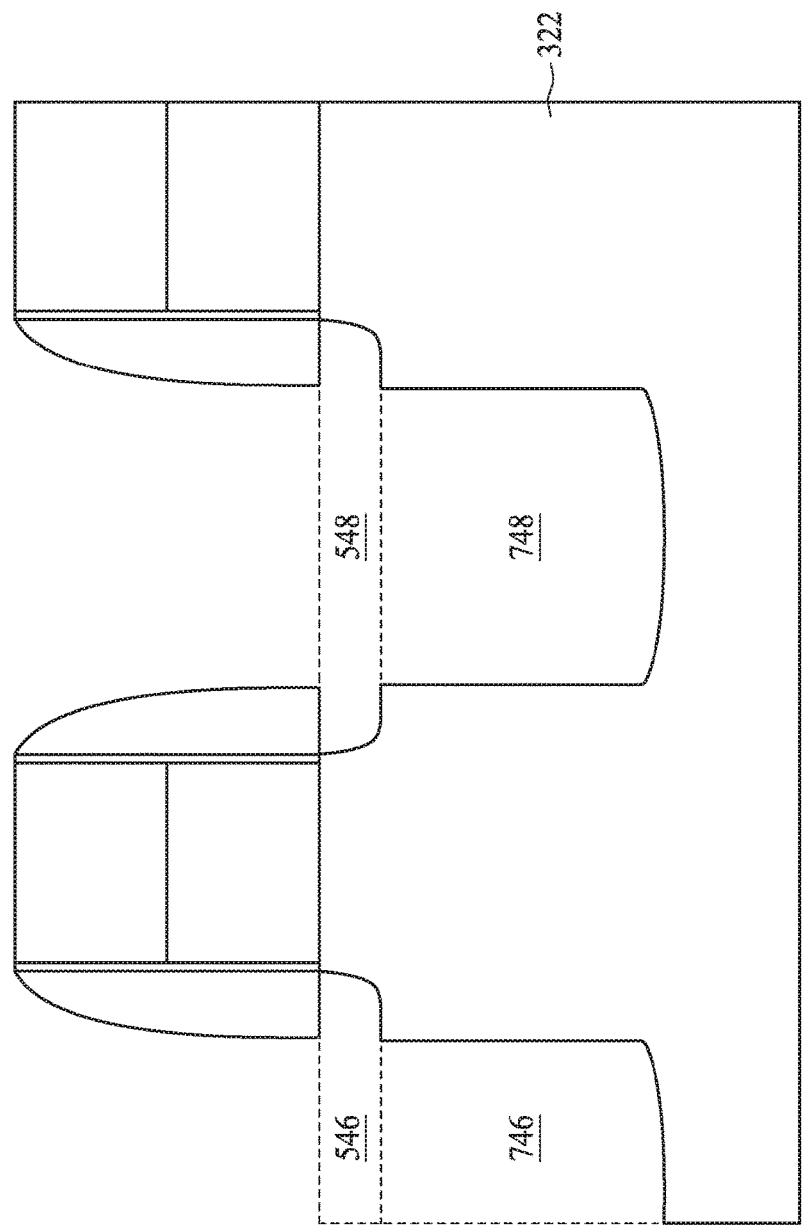
FIG. 14 is a schematic cross-sectional diagram of a semiconductor structure formed by the operation 208 described with reference to FIG. 2 in accordance with other embodiments.

FIG. 14 is a schematic cross-sectional diagram of a semiconductor structure formed by the operation 208 described with reference to FIG. 2 in accordance with other embodiments. The cross-sectional diagram in FIG. 14 is along the gate length $L_{g1}$ (labeled in FIG. 3C) of the sacrificial gate structure 332. Compared to the embodiments described with references to FIGS. 6 and 7 which form doping regions 642 and 644 to enhance the etch rate of, for example, dry chemical etching to form the recess extensions 742 and 744, recess extensions 746 and 748 in FIG. 14 are formed using reactive ion etching which involves inducing chemical reaction at a surface to be etched by impinging ions, electrons, or photons. The recess extensions 746 and 748 formed by reactive ion etching has a rectangular-shaped profile which is more anisotropic than the recess extensions 742 and 744 formed by doping and dry chemical etching.

Figure 15:
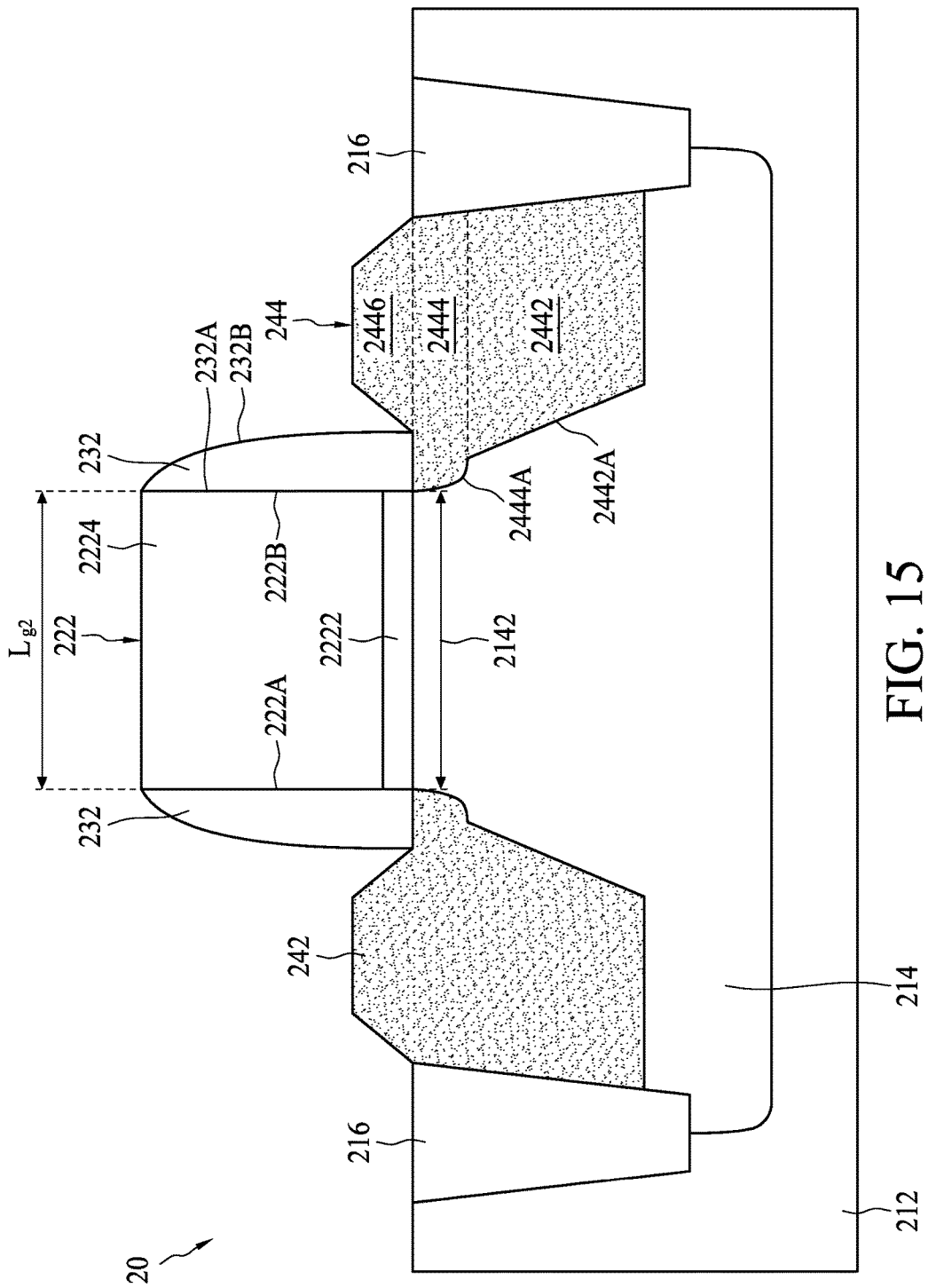
FIG. 15 is a schematic cross-sectional diagram of a MOSFET structure having source and drain regions containing epitaxially grown stressor material in accordance with some embodiments.

FIG. 15 is a schematic cross-sectional diagram of a MOSFET structure 20 having source and drain regions 242 and 244 containing epitaxially grown stressor material in accordance with some embodiments. The MOSFET structure 20 includes a body structure 214, dielectric isolation regions 216, a gate structure 222 with spacers 232, and source and drain regions 242 and 244.

In some embodiments, the MOSFET structure 20 includes a p-type FET. The body structure 214 is an N-well region in a p-type substrate 212. In some embodiments, the substrate 212 is a bulk semiconductor substrate in a crystalline structure, such as a bulk silicon substrate. The substrate 212 is doped with p-type dopants to form the p-type substrate. A region in the substrate 212 is further doped with n-type dopants such as phosphorous (P) and arsenic (As) to form the N-well region. In other embodiments, the body structure (not shown) is an n-type substrate. In some embodiments, the MOSFET structure (not shown) includes an n-type FET. The body structure is the p-type substrate 212.

In some embodiments, the gate structure 222 is formed on the body structure 214. The gate structure 222 includes a gate dielectric layer 2222 formed on the body structure 214 and a gate electrode 2224 formed on the gate dielectric layer 2222. In some embodiments, the gate dielectric layer 2222 includes a high-k dielectric material as described with reference to FIG. 1A. In some embodiments, the gate electrode 2224 includes one or more layers such as work function metal layers and a metal layer similar to the work function metal layers and the fill metal in the gate electrode 1324 described with reference to FIG. 1A, respectively.

In some embodiments, the dielectric isolations regions 216 are formed at two ends of a boundary of the body structure 214 to isolate the MOSFET structure 20. In some embodiments, the dielectric isolation regions 216 includes similar material as the dielectric isolation region 114 described with reference to FIG. 1B.

In some embodiments, the source and drain regions 242 and 244 containing epitaxially grown stressor material are configured on opposite sides of the gate structure 222 and abut the dielectric isolation regions 216. In some embodiments, the gate structure 222 has opposite side walls 222A and 222B across a gate length $L_{g2}$ of the gate structure 132. Spacers 232 are formed on the side walls 222A and 222B of the gate structure 222. The source and drain regions 242 and 244 are configured beside the spacers 232 and have regions that are embedded in the body structure 214, such as a region 2442 and a region 2444, and a region beyond the body structure 214, such as a region 2446. The regions 2442, 2444 and 2446 in FIG. 15 are similar to the regions 1442, 1444 and 1446 described with reference to FIG. 1C. One of the differences between the region 1446 and the region 2446 is that the region 1446 has an elliptical-shaped profile while the region 2446 has a diamond-shaped profile. A wall section of the diamond-shaped profile forming a vertex with a wall section 2442A of the diamond-shaped profile is replaced by a wall section 2444A of the region 2444.

The wall section 2444A is under the spacer 232 and tapers towards a plane in the body structure 214 aligned with the gate side wall 222B from a bottom of the wall section 2444A to a top of the wall section 2444A. The bottom of the wall section 2444A is aligned or more closely aligned with a side wall 232B of the spacer 232, and the top of the wall section 2444A is aligned or more closely aligned with a side wall 232A of the spacer 232. Therefore, the wall section 2444A has a closer proximity to the channel region 2222 than the replaced wall section forming the vertex with the wall section 2442A of the diamond-shaped profile. The stressor material forming the source and drain regions 242 and 244 are similar to that forming the source and drain regions 142 and 144 described with reference to FIG. 1C and are omitted here.

Figure 16:
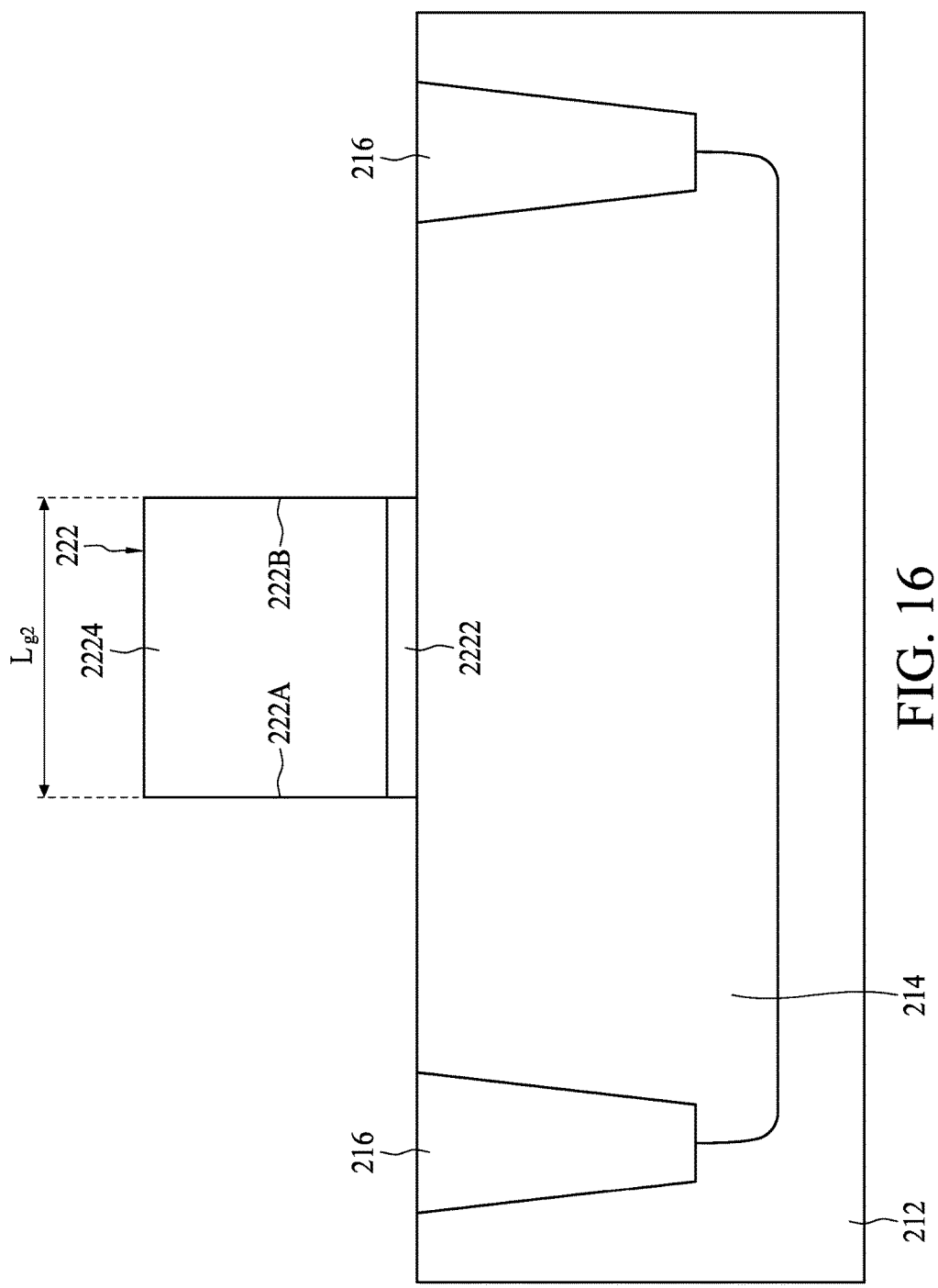
FIGS. 16 to 19 are schematic cross-sectional diagrams illustrating semiconductor structures after each operation of a method for forming the MOSFET structure in FIG. 15 in accordance with some embodiments.

FIGS. 16 to 19 and FIG. 15 are schematic cross-sectional diagrams illustrating semiconductor structures after each operation of a method for forming the MOSFET structure 20 in FIG. 15 in accordance with some embodiments. The method illustrated in FIGS. 16 to 19 and FIG. 15 provide further details to the method described with reference to FIG. 2. In operation 202, a body structure with a gate structure configured thereon is provided. Referring to FIG. 16, in some embodiments, the body structure 214 is a well region in the substrate 212. The substrate 212 is doped with one conductivity type such as p type while the body structure 214 is doped with an opposite conductivity type such as n type. Trenches are formed at two ends of a boundary of the body structure 214, and are filled with one or more dielectric materials to form the dielectric isolation regions 216. Compared to the gate structure 132' (shown in FIG. 11) which is formed by a replacement gate process, the gate structure 222 is formed by a non-replacement gate process. A gate dielectric layer is blanket deposited on the substrate 212 and one or more metal layers are deposited on the gate dielectric layer. In some embodiments, the gate dielectric layer and one or more metal layers are deposited using CVD, ALD, or other deposition methods deemed appropriate by those skilled in the art. The materials of the gate dielectric layer and the one or more metal layers are similar to those described with reference to FIG. 1B and are omitted here. In order to pattern the gate dielectric layer and the one or more metal layers into the gate dielectric layer 2222 and the gate electrode 2224, a photoresist layer is deposited over the one or more metal layers and patterned into a photoresist mask that defines the desired area of the gate structure 222. The pattern of the photoresist mask is then transferred to the underlying one or more metal layers and the gate dielectric layer. In some embodiments, a hard mask is formed on the one or more metal layers to facilitate transferring of the pattern defined by the photoresist layer and to protect the gate electrode 222 from being affected by subsequent processing operations. In some embodiments, the transferring of the pattern from the photoresist mask to the underlying layers is performed by anisotropic etching. The formed gate structure 222 has vertical gate side walls 222A and 222B across the gate length $L_{g2}$.

Figure 17:
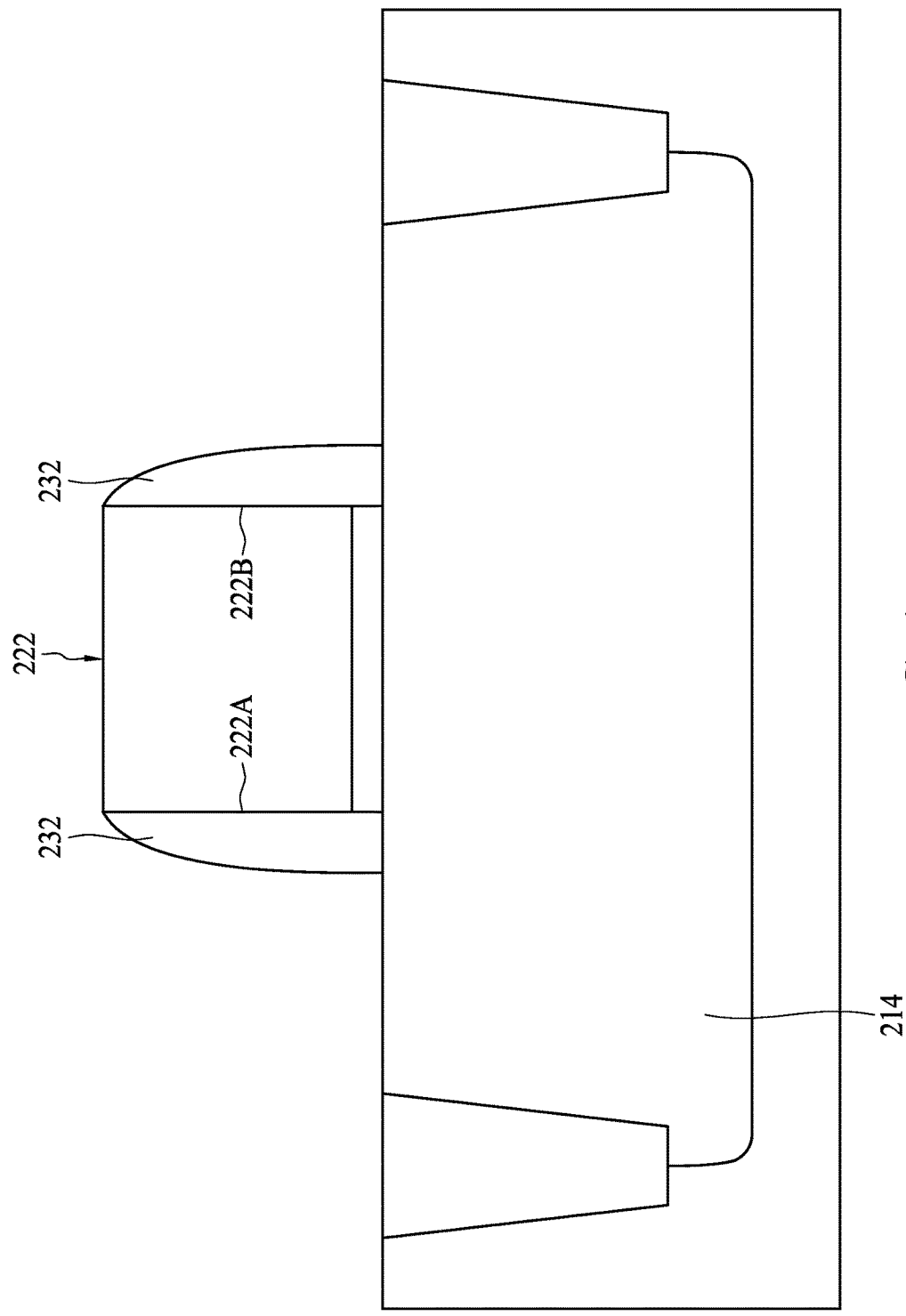

In operation 204, a spacer is formed over a gate side wall of a gate structure. Referring to FIG. 17, in some embodiments, the spacer 232 is formed on the gate side walls 222A and 222B of the gate structure 222. Each spacer 232 can include one or more layers. In some embodiments, material and a method for forming the spacers 232 are similar to those of the spacers 3344 described with reference to FIG. 4.

Figure 18:
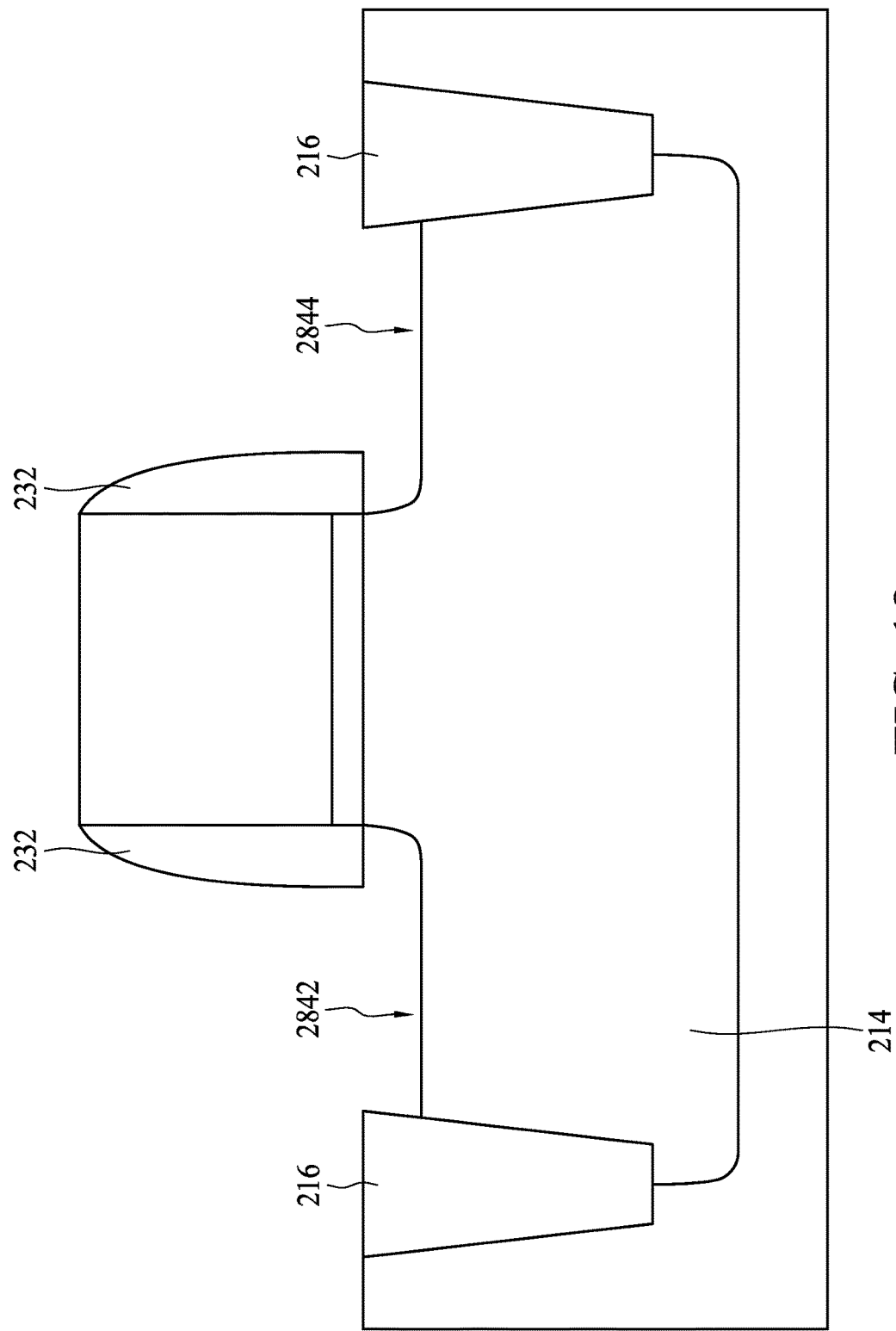

In operation 206, a recess beside the spacer and extending laterally under the spacer is formed in the body structure. Referring to FIG. 18, in some embodiments, recesses 2842 and 2844 are formed in the body structure 214 between the spacers 232 and the dielectric isolation regions 216. The recesses 2842 and 2844 extend laterally under the spacers 232. The recesses 2842 and 2844 are formed similarly as the recesses 542 and 544 described with reference to FIG. 5.

Figure 19:
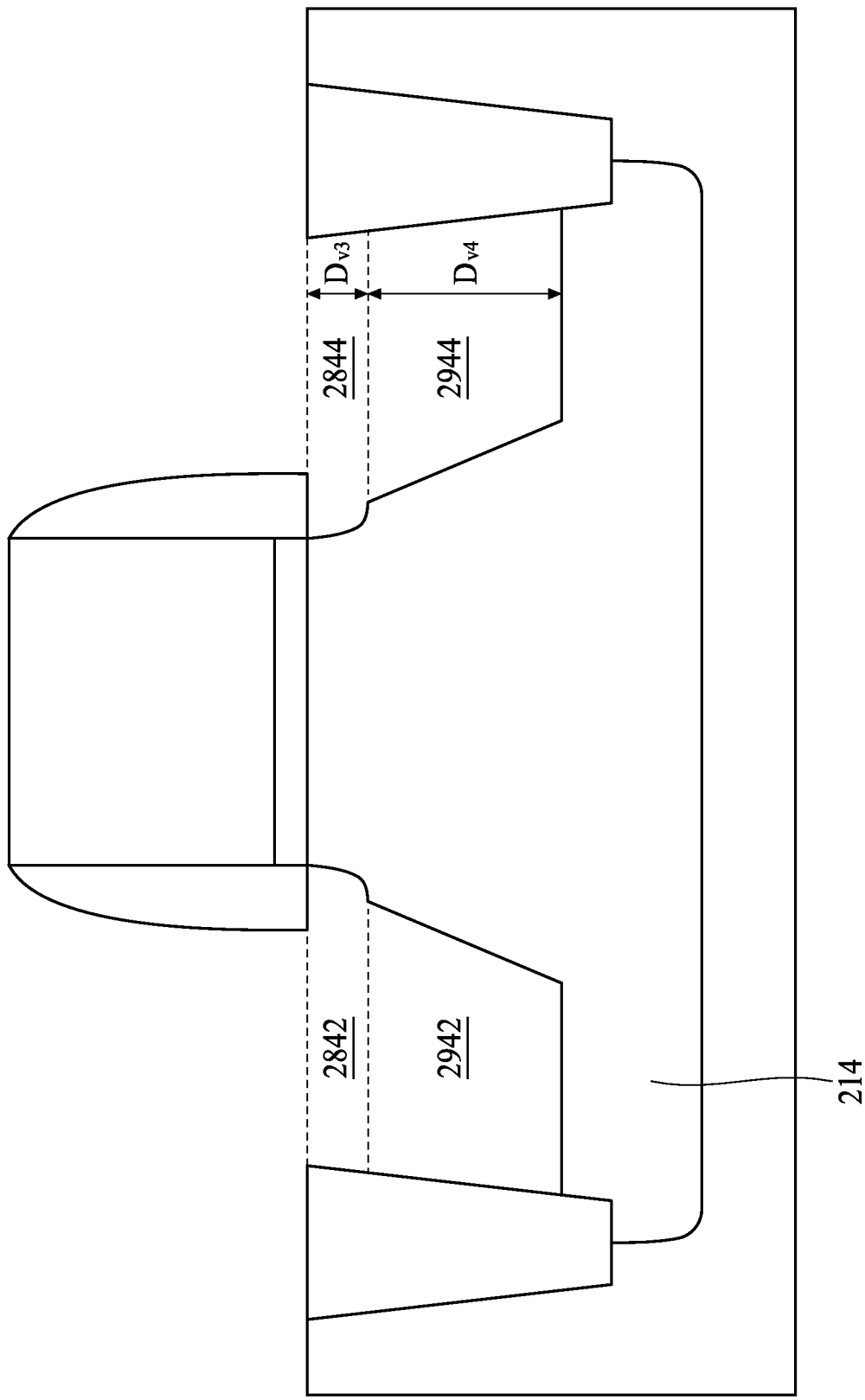

In operation 208, a recess extension is formed under the recess to extend a vertical depth of the recess. Referring to FIG. 19, in some embodiments, a vertical depth $D_{v3}$ of the recess 2844 is extended by a recess extension 2944 with a vertical depth $D_{v4}$ so that an extended recess has a total vertical depth of $D_{v3}+D_{v4}$. In some embodiments, the recess extension 2944 is formed by a dry etch first to reach the vertical depth $D_{v4}$ with respect to the recess 2844, and then by an anisotropic wet etch to form the diamond-shaped profile. Anisotropic wet etching is also known as orientation-dependent wet etching which has different etch rate along different crystal directions. In some embodiments, the recess extensions 2942 and 2944 are formed such that the recesses 2842 and 2844 protrude laterally from the recess extensions 2942 and 2944. Although the recess extensions 744 and 748 for the FinFET structure described with references to FIGS. 7 and 14 have the elliptical-shaped profile and the rectangular-shaped profile, and the recess extension 2944 for the MOSFET structure described with reference to FIG. 19 has the diamond-shaped profile, the elliptical-shaped and rectangular-shaped profiles are applicable to the MOSFET structure, and the diamond-shaped profile is applicable to the FinFET structure.

In operation 210, stressor material with a lattice constant different from that of the body structure is grown in the extended recess. The extended recess includes the recess 2842 or 2844 and the recess extension 2942 or 2944 shown in FIG. 19. Referring to FIG. 15, in some embodiments, stressor material is grown in the extended recess and beyond the extended recess to form the source and drain regions 242 and 244. The method for growing the stressor material and the stressor material are similar to those described with reference to FIG. 8 and FIG. 1C, and are omitted here.

Similar to the method described with references to FIGS. 3A to 11, a proximity of the source or drain region 242 or 244 (shown in FIG. 15) to the gate side wall 222A or 222B and a volume of the source or drain region 242 or 244 are controlled separately by the operation for forming the recess 2842 or 2844 (shown in FIG. 18) and the operation for forming the recess extension 2942 or 2944 (shown in FIG. 19). Therefore, the proximity of the source or drain region 242 or 244 to the channel region 2142 (shown in FIG. 15) is stable. Further, optimization of the operations for forming the recess 2842 or 2844 and the recess extension 2942 or 2944 can be directed to a lateral etch rate, and a vertical etch rate, respectively.

In some embodiments, in a method, a body structure with a gate structure configured thereon is provided. The gate structure comprises a gate side wall traversing the body structure. A spacer is formed over the gate side wall. A first recess is formed in the body structure. The first recess is formed beside the spacer and extending laterally under the spacer. A recess extension is formed under the first recess to extend a vertical depth of the first recess. Stressor material with a lattice constant different from that of the body structure is grown such that the extended first recess is filled.

In some embodiments, in a method, a body structure with a gate structure configured thereon is provided. The gate structure comprises a gate side wall traversing the body structure. A spacer is formed over the gate side wall. A first recess is formed in the body structure. The first recess is formed beside the spacer such that a surface of the spacer covered by the body structure is exposed. Stressor material with a lattice constant different from that of the body structure is grown such that the extended first recess is filled.

In some embodiments, a semiconductor structure includes a body structure, a gate structure, a spacer and a source or drain region. The gate structure is configured on the body structure. The gate structure comprises a gate side wall traversing the body structure. The source or drain region is embedded in the body structure beside the gate structure. The source or drain region contains stressor material with a lattice constant different from that of the body structure. The source or drain region comprises a first region and a second region. The first region extends laterally under the spacer. The second region is configured under the first region and extends a vertical depth of the first region.

The above description includes exemplary operations, but these operations are not necessarily required to be performed in the order shown. Operations may be added, replaced, changed order, and/or eliminated as appropriate, in accordance with the spirit and scope of the disclosure. Accordingly, the scope of the disclosure should be determined with reference to the following claims, along with the full scope of equivalences to which such claims are entitled.

What is claimed is:

1. A method, comprising:
    providing a body structure with a gate structure configured thereon;
        the gate structure comprising a gate side wall;
    forming a spacer over the gate side wall;
    forming a first recess in the body structure by etching a portion of the body structure,
        the first recess being formed beside the spacer and extending laterally under the spacer, and the etched portion of the body structure overall having a substantially the same doping concentration as neighboring body structure around the etched portion of the body structure;
    forming a recess extension under the first recess, including:
        forming an etch rate control doping region in the body structure under the first recess and beside the spacer to increase an etch rate of the etch rate control doping region; and
    anisotropic etching the body structure to form the recess extension; and
    growing stressor material with a lattice constant different from that of the body structure such that the extended first recess is filled;
    wherein the first recess constantly tapers from a top surface of the body structure to a bottom of the first recess, and the etch rate control doping region is free from overlapping the spacer from a top view.

2. The method of claim 1, wherein:
    providing a body structure with a gate structure configured thereon comprises:
        providing the body structure comprising a fin structure; and
        forming the gate structure wrapping around a portion of the fin structure.

3. The method of claim 1, wherein:
    forming a first recess in the body structure comprises:
        isotropic etching the body structure until reaching a lateral depth within a range of a first distance between a first side wall and a second side wall of the spacer at a level of the top surface of the body structure, and a second distance between the first side wall of the spacer and the gate side wall at the level of the top surface of the body structure,
        the first side wall of the spacer being closer to the gate side wall than the second side wall of the spacer.

4. The method of claim 3, wherein:
    forming a spacer over the gate side wall comprises:
        forming a sealing layer on the gate side wall; and
        forming the spacer on the sealing layer.

5. The method of claim 3, wherein:
    forming a spacer over the gate side wall comprises:
        forming the spacer on the gate side wall.

6. The method of claim 1, wherein:
    forming a recess extension under the first recess comprises:

anisotropic reactive ion etching the body structure to form the recess extension.

7. The method of claim 1, wherein:
providing a body structure with a gate structure configured thereon comprises:
   providing a substrate comprising the body structure; and
   forming the gate structure above the body structure.

8. The method of claim 7, wherein:
forming a recess extension under the first recess comprises:
   anisotropic dry etching the body structure; and
   anisotropic wet etching the body structure to form a profile of the recess extension.

9. A method, comprising:
providing a body structure with a gate structure configured thereon, the body structure having a first doping concentration;
the gate structure comprising a gate side wall;
forming a spacer over the gate side wall;
forming a first recess in the body structure by etching a portion of the body structure,
   the first recess being formed beside the spacer such that a surface of the spacer covered by the body structure is exposed, and the etched portion of the body structure having the first doping concentration;
forming a recess extension under the first recess, including:
   forming an etch rate control doping region in the body structure under the first recess and beside the spacer; and
   anisotropic etching the body structure to form the recess extension; and
growing stressor material with a lattice constant different from that of the body structure such that the extended first recess is filled;
wherein the first recess constantly tapers from a top surface of the body structure to a bottom of the first recess, and the etch rate control doping region extends from the bottom of the first recess to the body structure under the first recess, and the etch rate control doping region is free from overlapping the spacer from a top view.

10. The method of claim 9, wherein the first recess has a wall section under the spacer,
a top of the wall section at least substantially extends to a first side wall of the spacer at a level of the top surface of the body structure, and the first side wall of the spacer is closer to the gate side wall than a second side wall of the spacer.

11. The method of claim 10, wherein:
at a level of a top surface of the body structure, the wall section of the first recess possesses a distance from the gate side wall smaller than or substantially equal to a distance of the second side wall of the spacer from the gate side wall.

12. The method of claim 10, wherein:
at a level of a top surface of the body structure, the wall section is located within a region between the surface of the spacer exposed by the first recess and the gate side wall.

13. The method of claim 9, wherein:
forming a spacer over the gate side wall comprises:
   forming a sealing layer on the gate side wall; and
   forming the spacer on the sealing layer.

14. The method of claim 9, wherein:
forming a spacer over the gate side wall comprises:
   forming the spacer on the gate side wall.

15. The method of claim 9, wherein:
providing a body structure with a gate structure configured thereon comprises:
   providing a substrate including the body structure; and
   forming the gate structure above the body structure.

16. A method, comprising:
providing a substrate with a gate structure configured thereon, wherein the gate structure comprises opposite side walls across a gate length of the gate structure;
forming a spacer over each of the side walls;
forming a recess beside the spacer of each of the side walls, wherein the recess extends laterally under the spacer and vertically to a vertical depth; and
growing stressor material with a lattice constant different from that of the substrate to fill the recess;
wherein forming the recess beside the spacer of each of the side walls comprises:
   etching the substrate until substantially reaching a lateral depth at least extending to a first side wall of the spacer at a level of a top surface of the substrate to form a first recess, and the first side wall of the spacer being closer to the side walls of the gate structure than a second side wall of the spacer; and
   forming an etch rate control doping region in the substrate under the first recess and beside the spacer to increase an etch rate of the etch rate control doping region, wherein the etch rate control doping region is free from overlapping the spacer from a top view;
wherein the first recess constantly tapers toward a plane in the substrate from the top surface of the substrate to a bottom of the recess.

17. The method of claim 16, wherein:
forming a recess beside the spacer of each of the side walls comprises:
   anisotropic reactive ion etching the substrate to form the recess.

18. The method of claim 16, wherein:
forming a recess beside the spacer of each of the side walls comprises:
   anisotropic dry etching the substrate to extend the vertical depth; and
   anisotropic wet etching the substrate to form a profile of the recess.

19. The method of claim 16, wherein:
forming the spacer over each of the side walls comprises:
   forming a sealing layer on each of the side walls; and
   forming the spacer on the sealing layer.

20. The method of claim 16, wherein:
forming the spacer over each of the side walls comprises:
   forming the spacer on each of the side walls.

* * * * *